(12) United States Patent
Yoo et al.

(10) Patent No.: US 11,730,002 B2
(45) Date of Patent: Aug. 15, 2023

(54) DISPLAY DEVICE

(71) Applicant: Samsung Display Co., LTD., Yongin-si (KR)

(72) Inventors: Je Won Yoo, Bucheon-si (KR); In Hyuk Kim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 8 days.

(21) Appl. No.: 17/382,966

(22) Filed: Jul. 22, 2021

(65) Prior Publication Data

US 2022/0037404 A1    Feb. 3, 2022

(30) Foreign Application Priority Data

Jul. 28, 2020   (KR) .................. 10-2020-0093660

(51) Int. Cl.
| | | |
|---|---|---|
| *H01L 51/00* | (2006.01) | |
| *H01L 33/26* | (2010.01) | |
| *H10K 19/20* | (2023.01) | |
| *H01L 33/00* | (2010.01) | |
| *H01L 33/32* | (2010.01) | |
| *H10K 59/122* | (2023.01) | |
| *H10K 71/00* | (2023.01) | |

(52) U.S. Cl.
CPC ......... *H10K 19/20* (2023.02); *H01L 33/0075* (2013.01); *H01L 33/32* (2013.01); *H10K 59/122* (2023.02); *H10K 71/00* (2023.02)

(58) Field of Classification Search
CPC ............... H01L 27/3246; H01L 25/048; H01L 2251/50; H01L 33/26–34; H01L 51/0032; H01L 51/5068; H01L 51/5296
See application file for complete search history.

(56) References Cited

U.S. PATENT DOCUMENTS

| | | | | |
|---|---|---|---|---|
| 10,461,123 B2* | 10/2019 | Kim | ..................... | H01L 27/1255 |
| 10,847,591 B1* | 11/2020 | Kim | ..................... | H01L 27/3246 |
| 2021/0367109 A1* | 11/2021 | Song | ....................... | H01L 33/20 |
| 2022/0238756 A1* | 7/2022 | Kang | ....................... | H01L 33/38 |

FOREIGN PATENT DOCUMENTS

KR    10-1436123    11/2014

* cited by examiner

*Primary Examiner* — Fernando L Toledo
*Assistant Examiner* — Valerie N Newton
(74) *Attorney, Agent, or Firm* — Kile Park Reed & Houtteman PLLC

(57) ABSTRACT

A display device includes a first bank and a second bank spaced apart from each other on a substrate, at least one semiconductor layer disposed between the first bank and the second bank, a first electrode disposed on the first bank and electrically connected to a part of the at least one semiconductor layer, an organic functional layer disposed on another part of the semiconductor layer and comprising at least an organic light emitting layer, and a second electrode disposed on the organic functional layer.

20 Claims, 15 Drawing Sheets

100: CNE1, 34, OL, CNE2

100: CNE1, 36, OL, CNE2

DISPLAY DEVICE

CROSS-REFERENCE TO RELATED APPLICATION(S)

This application claims priority to and benefit of Korean Patent Application No. 10-2020-0093660 under 35 U.S.C. § 119, filed on Jul. 28, 2020, the entire contents of which is incorporated herein by reference.

BACKGROUND

1. Field of the Disclosure

The disclosure relates to a display device.

2. Description of the Related Art

Display devices become more and more important as multimedia technology evolves. Accordingly, a variety of types of display devices such as organic light-emitting display (OLED) devices and liquid-crystal display (LCD) devices are currently used.

Display devices are for displaying images and include a display panel such as an organic light-emitting display panel or a liquid-crystal display panel. Among them, light-emitting display panel may include light-emitting elements. For example, light-emitting diodes (LEDs) may include an organic light-emitting diode (OLED) using an organic material as a fluorescent material, and an inorganic light-emitting diode using an inorganic material as a fluorescent material.

In the field of display technology, displays may include tablet computers, smartphone displays, computer monitors, smart watches, personal digital assistants (PDA), and the like. These devices use various forms of displays such as light emitting diodes (LED), organic light emitting diodes (OLED), active-matrix organic light emitting diodes (AMO-LED), and the like. Displays are one of the leading causes of power drainage and/or circuit issues in many portable devices relying on battery life.

Such a display apparatus may include, as a driving circuit, a thin-film transistor (TFT), a capacitor, etc. The thin-film transistor may include an active layer including a channel area, a source area, and a drain area, and a gate electrode electrically insulated from the active layer by a gate insulating layer. In general, the active layer of the thin-film transistor may include amorphous silicon or polysilicon.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device that has increased emission area to thereby improve the luminous efficiency and that can be fabricated easily.

It should be noted that objects of the disclosure are not limited to the above-mentioned object; and other objects of the disclosure will be apparent to those skilled in the art from the following descriptions.

According to an embodiment of the disclosure, an emission area may be formed in the form of a surface light source, thereby increasing the emission area and improving the luminous efficiency.

By forming a light emitting layer in a curved shape along the shape of a semiconductor layer, light emitted from the emission area may exit through the upper and side portions, thereby improving the viewing angle.

It should be noted that effects of the disclosure are not limited to those described above and other effects of the disclosure will be apparent to those skilled in the art from the following descriptions.

According to an embodiment of the disclosure, the display device may comprise a first bank and a second bank spaced apart from each other and disposed on a substrate, at least one semiconductor layer disposed between the first bank and the second bank, a first electrode disposed on the first bank and electrically connected to a part of the at least one semiconductor layer, an organic functional layer disposed on another part of the at least one semiconductor layer and comprising an organic light emitting layer, and a second electrode disposed on the organic functional layer.

In an embodiment, the at least one semiconductor layer may comprise an n-type dopant and is made of a semiconductor having chemical formula:

$$Al_xGa_yIn_{1-x-y}N$$

wherein $0 \leq x \leq 1$, $0 \leq y \leq 1$ and $0 \leq x+y \leq 1$.

In an embodiment, the organic functional layer may comprise at least one of a hole transport layer and a hole injection layer between the organic light emitting layer and the second electrode.

In an embodiment, the first electrode may be a cathode electrode, and the second electrode may be an anode electrode.

In an embodiment, the at least one semiconductor layer may comprise a p-type dopant and is made of a semiconductor having chemical formula:

$$Al_xGa_yIn_{1-x-y}N$$

wherein $0 \leq x \leq 1$, $0 \leq y \leq 1$ and $0 \leq x+y \leq 1$.

In an embodiment, the organic functional layer may comprise at least one of an electron transport layer and an electron injection layer between the organic light emitting layer and the second electrode.

In an embodiment, the first electrode may be an anode electrode, and the second electrode may be a cathode electrode.

In an embodiment, the first electrode may overlap the first bank and extend parallel to the first bank, and the first electrode may contact a side surface and a part of an upper surface of the at least one semiconductor layer.

In an embodiment, the second electrode may extend parallel to the first electrode and overlap the at least one semiconductor layer and the organic functional layer, and an area where the at least one semiconductor layer, the organic functional layer and the second electrode overlap one another may be an emission area.

In an embodiment, the display device may further comprise an insulating layer that extends parallel to the first electrode, crosses a direction in which the at least one semiconductor layer extends, and overlaps the at least one semiconductor layer.

In an embodiment, the at least one semiconductor layer may have a shape of a cylinder, a rod, a wire, a polygonal column, or a combination thereof.

According to an embodiment of the disclosure, the display device may comprise a first bank and a second bank spaced apart from each other and disposed on a substrate, at least one semiconductor layer disposed between the first bank and the second bank and comprising an inorganic light emitting layer surrounding an outer circumferential surface of the at least one semiconductor layer, a first electrode disposed on the first bank and electrically connected to a part of the at least one semiconductor layer, an organic functional layer disposed on the inorganic light emitting layer of the at least one semiconductor layer, and a second electrode disposed on the organic functional layer.

In an embodiment, the at least one semiconductor layer may comprise a semiconductor part surrounded by the inorganic light emitting layer, and ends of the semiconductor part in a longitudinal direction are aligned with ends of the inorganic light emitting layer in the longitudinal direction, respectively.

In an embodiment, the semiconductor part comprises an n-type dopant and may be made of a semiconductor having chemical formula:

$Al_xGa_yIn_{1-x-y}N$ wherein $0 \leq x \leq 1$, $0 \leq y \leq 1$ and $0 \leq x+y \leq 1$.

In an embodiment, the organic functional layer may comprise at least one of a hole transport layer and a hole injection layer between the inorganic light emitting layer and the second electrode.

In an embodiment, the first electrode may be a cathode electrode, and the second electrode may be an anode electrode.

In an embodiment, the semiconductor part may comprise a p-type dopant and may be made of a semiconductor having chemical formula:

$Al_xGa_yIn_{1-x-y}N$ wherein $0 \leq x \leq 1$, $0 \leq y \leq 1$ and $0 \leq x+y \leq 1$.

In an embodiment, the organic functional layer may comprise at least one of an electron transport layer and an electron injection layer between the inorganic light emitting layer and the second electrode.

In an embodiment, the first electrode may be an anode electrode, and the second electrode may be a cathode electrode.

In an embodiment, the first electrode may overlap the first bank and extend parallel to the first bank, and the first electrode may contact an end of the semiconductor part of the at least one semiconductor layer.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
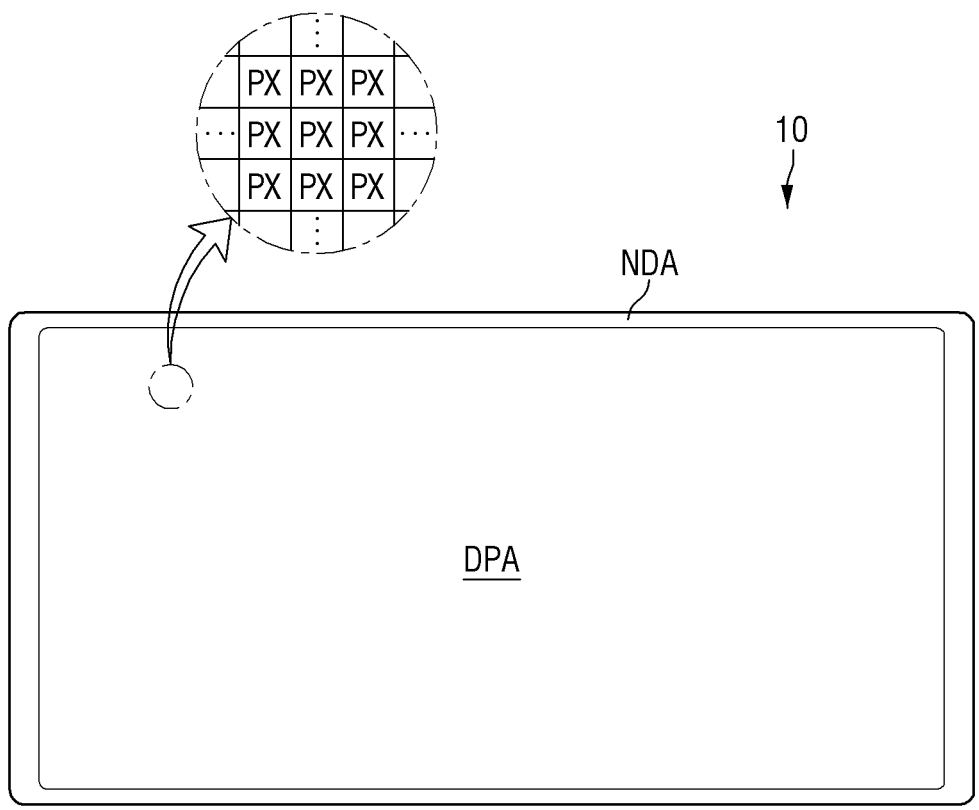
FIG. 1 is a plan view of a display device according to an embodiment of the disclosure.
Figure 1:
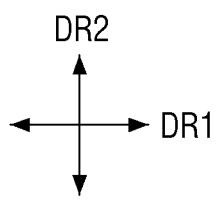

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it may be directly on the other layer or substrate, or intervening layers may also be present. The same reference numbers indicate the same components throughout the specification.

Each of the features of the various embodiments of the disclosure may be combined or combined with each other, in part or in whole, and technically various interlocking and driving are possible. Each embodiment may be implemented independently of each other or may be implemented together in an association.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element. For example, the expression "A and/or B" indicates only A, only B, or both A and B. The expression "at least one of A and B" indicates only A, only B, or both A and B.

The terms "and" and "or" may be used in the conjunctive or disjunctive sense and should generally be interpreted as "and/or". Throughout the disclosure, the expression "at least one of a, b, and c" indicates only a, only b, only c, both a and b, both a and c, both b and c, all of a, b, and c, or variations thereof.

In this specification, it will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. To the contrary, it will be understood that, when an element (for example, a first element) is "directly coupled with/to" or "directly connected to" another element (for example, a second element), there is no intervening element (for example, a third element) between the element and another element.

Hereinafter, embodiments of the disclosure and items required for those skilled in the art to easily understand the content of the disclosure will be described in detail with reference to the accompanying drawings. In the following description, singular forms in the disclosure are intended to include the plural forms as well, unless the context clearly indicates otherwise.

The term "overlap" may include layer, stack, face or facing, extending over, extending under, covering or partly covering or any other suitable term as would be appreciated and understood by those of ordinary skill in the art. The phrase "not overlap" may include apart from or set aside from or offset from and any other suitable equivalents as would be appreciated and understood by those of ordinary skill in the art.

Terms such as "about", "approximately", and "substantially" as used herein are inclusive of the stated value and mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, ±30%, 20%, or 5% of the stated value.

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments of the disclosure will be described with reference to the accompanying drawings.

FIG. 1 is a plan view of a display device according to an embodiment of the disclosure.

Referring to FIG. 1, the display device 10 displays a moving image or a still image. The display device 10 may refer to any electronic device that provides a display screen. For example, the display device 10 may include a television set, a laptop computer, a monitor, an electronic billboard, the Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, etc.

The display device 10 includes a display panel for providing a display screen. Examples of the display panel may include an inorganic light-emitting diode display panel, an organic light-emitting display panel, a quantum-dot light-emitting display panel, a plasma display panel, a field emission display panel, etc. In the following description, an inorganic light-emitting diode display panel is employed as an example of the display panel 10, but the disclosure is not limited thereto. Any other display panel may be employed as long as the technical idea of the disclosure may be equally applied.

The shape of the display device 10 may be modified in a variety of ways. For example, the display device 10 may have shapes such as a rectangle with longer lateral sides, a rectangle with longer vertical sides, a square, a quadrangle with rounded corners (vertices), other polygons, a circle, etc. The shape of a display area DPA of the display device 10 may also be similar to the overall shape of the display device 10. FIG. 1 shows the display device 10 in the shape of a rectangle with longer horizontal sides and the display area DPA.

The display device 10 may include the display area DPA and a non-display area NDA. In the display area DPA, images may be displayed. In the non-display area NDA, images are not displayed. The display area DPA may be referred to as an active area, while the non-display area NDA may also be referred to as an inactive area. The display area DPA may generally occupy the center of the display device 10.

The display area DPA may include pixels PX. The pixels PX may be arranged in a matrix. The shape of each pixel PX may be, but is not limited to, a rectangle or a square when viewed from the top. Each pixel may have a diamond shape having sides inclined with respect to a direction. The pixels PX may be arranged in stripes and PenTile® pattern alternately. Each of the pixels PX may include at least one light-emitting element 100 that emits light of a particular wavelength band to represent a color.

The non-display area NDA may be disposed around the display area DPA. The non-display area NDA may surround the display area DPA entirely or partially. The display area DPA may have a rectangular shape, and the non-display area NDA may be disposed to be adjacent to the four sides of the display area DPA. The non-display area NDA may form the bezel of the display device 10. Lines or circuit drivers included in the display device 10 may be disposed in each of the non-display area NDA, or external devices may be mounted.

Figure 2:
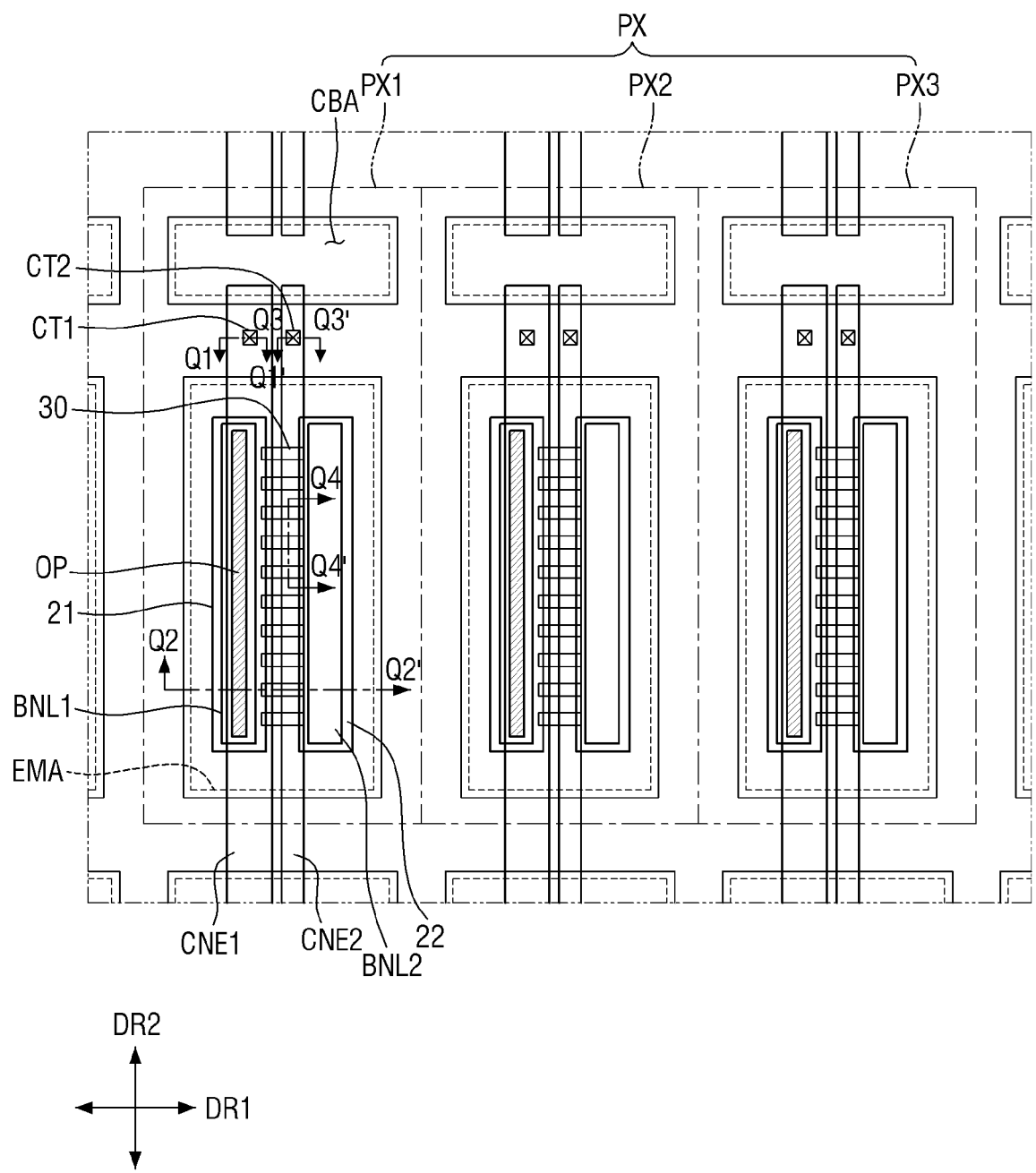
FIG. 2 is a plan view showing a pixel of a display device according to an embodiment of the disclosure.

FIG. 2 is a plan view showing a pixel of a display device according to an embodiment of the disclosure.

Referring to FIG. 2, each of the pixels PX may include sub-pixels PXn, where n is an integer from one to three. For example, a pixel PX may include a first sub-pixel PX1, a second sub-pixel PX2 and a third sub-pixel PX3. The first sub-pixel PX1 may emit light of a first color, the second sub-pixel PX2 may emit light of a second color, and the third sub-pixel PX3 may emit light of a third color. For example, the first color may be blue, the second color may be green, and the third color may be red. It is, however, to be understood that the disclosure is not limited thereto. All the sub-pixels PXn may emit light of the same color. Although the pixel PX includes three sub-pixels PXn in the example shown in FIG. 2, the disclosure is not limited thereto. The pixel PX may include more than two sub-pixels PXn.

Each of the sub-pixels PXn of the display device 10 may include an emission area EMA and a non-emission area (not shown). In the emission area EMA, the light-emitting elements 100 may be disposed to emit light of a particular wavelength. In the non-emission area, no light-emitting element 100 is disposed and light emitted from the light-emitting elements 100 do not reach and thus no light exits therefrom. The emission area may include an area in which the light-emitting elements 100 are disposed, and may include an area adjacent to the light-emitting elements 100 where lights emitted from the light-emitting element 100 exit.

It is, however, to be understood that the disclosure is not limited thereto. The emission area may also include an area in which light emitted from the light-emitting elements 100 is reflected or refracted by other elements to exit. The light-emitting elements 100 may be disposed in each of the sub-pixels PXn, and the emission area may include the area where the light-emitting elements are disposed and the adjacent area.

Each of the sub-pixels PXn may further include a cut area CBA disposed in the non-emission area. The cut area CBA may be disposed on one side of the emission area EMA in a second direction DR2. The cut area CBA may be disposed between the emission areas EMA of neighboring sub-pixels PXn in the second direction DR2. In the display area DPA of the display device 10, emission areas EMA and cut areas CBA may be arranged. For example, the emission areas EMA and the cut areas CBA may be arranged repeatedly in a first direction DR1, and may be arranged alternately in the second direction DR2. The spacing between the cut areas CBA in the first direction DR1 may be smaller than the spacing between the emission areas EMA in the first direction DR1. A second bank BNL2 may be disposed between the cut areas CBA and the emission areas EMA, and the distance between them may vary depending on the width of the second bank BNL2. Although the light-emitting elements 100 are not disposed in the cut areas CBA and thus no light exits therefrom, parts of electrodes 21 and 22 disposed in each of the sub-pixels PXn may be disposed there. The electrodes 21 and 22 disposed for each of the sub-pixels PXn may be disposed separately from each other in the cut area CBA.

Figure 3:
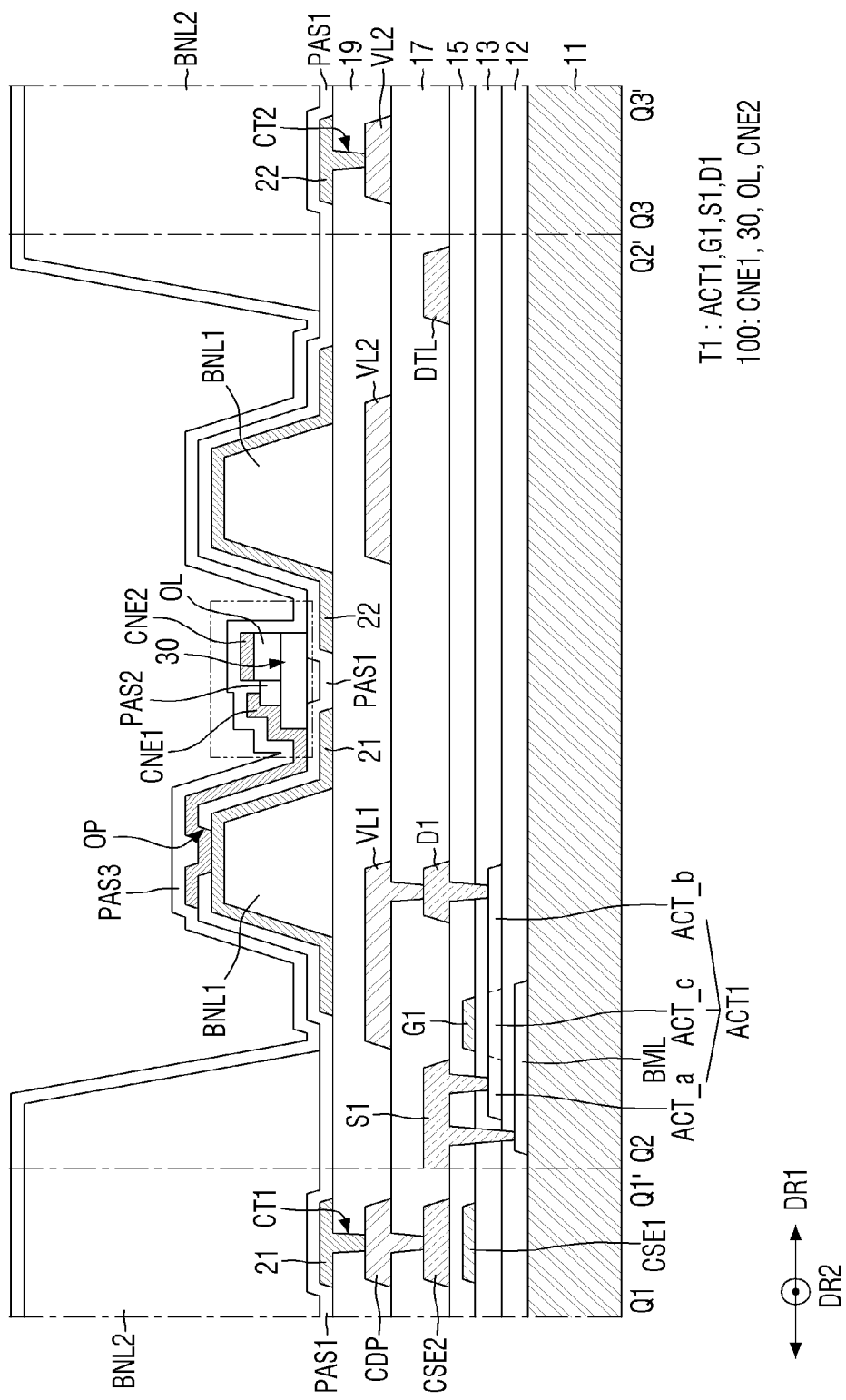
FIG. 3 is a cross-sectional view taken along lines Q1-Q1', Q2-Q2' and Q3-Q3' of FIG. 2.
Figure 4:
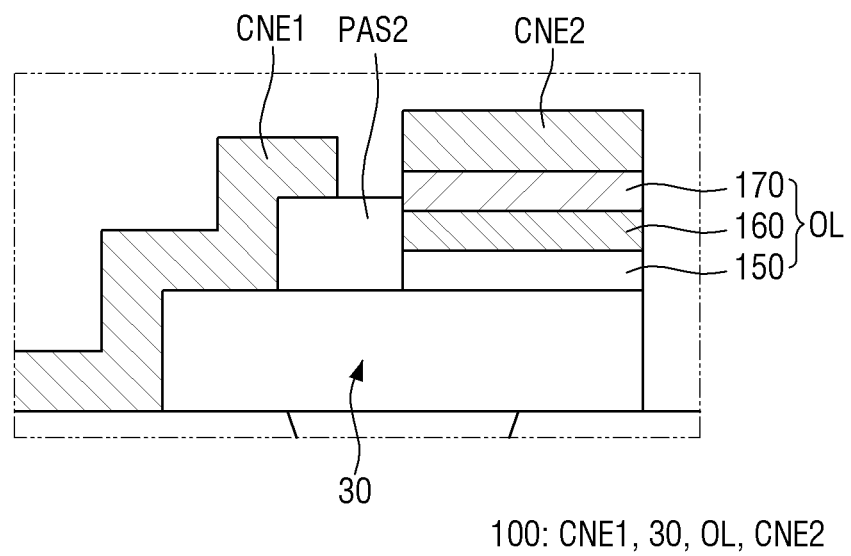
FIG. 4 is an enlarged, cross-sectional view of the light-emitting element of FIG. 3.
Figure 5:
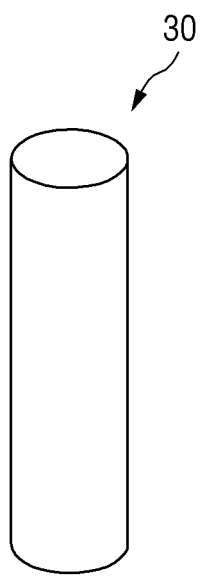
FIG. 5 is a perspective view schematically showing a semiconductor layer.

FIG. 3 is a cross-sectional view taken along lines Q1-Q1', Q2-Q2' and Q3-Q3' of FIG. 2. FIG. 4 is an enlarged, cross-sectional view of the light-emitting element of FIG. 3. FIG. 5 is a perspective view schematically showing a semiconductor layer. FIG. 3 is a view showing a cross section from one end to the other end of the light-emitting element 100 disposed in the first sub-pixel PX1 of FIG. 2.

Referring to FIG. 3 in conjunction with FIG. 2, the display device 10 may include a first substrate 11, a semiconductor layer disposed on the first substrate 11, conductive layers, and insulating layers. The semiconductor layer, the conductive layers and the insulating layers may form a circuit layer and an emission material layer of the display device 10.

Specifically, the first substrate 11 may be an insulating substrate. The first substrate 11 may be formed of an insulating material such as glass, quartz and a polymer resin. The first substrate 11 may be either a rigid substrate or a flexible substrate that can be bent, folded, or rolled.

A light-blocking layer BML may be disposed on the first substrate 11. The light-blocking layer BML may overlap an active layer ACT1 of a first transistor T1 of the display device 10. The light-blocking layer BML may include a material that blocks light, and thus can prevent light from entering the active layer ACT1 of the first transistor T1. For example, the light-blocking layer BML may be formed of an opaque metal material that blocks light transmission. It is, however, to be understood that the disclosure is not limited thereto. In some implementations, the light-blocking layer BML may be eliminated.

A buffer layer 12 may be disposed entirely on the first substrate 11, including the light-blocking layer BML. The buffer layer 12 may be formed on the first substrate 11 to protect the first thin-film transistors T1 of the pixels PX from moisture permeating through the first substrate 11 that is susceptible to moisture permeation, and may also provide a flat surface. The buffer layer 12 may be formed of inorganic layers stacked on one another alternately. For example, the buffer layer 12 may be made up of multiple layers in which inorganic layers including at least one of a silicon oxide (SiOx), a silicon nitride (SiNx) and silicon oxynitride (SiOxNy) are stacked on one another alternately.

The active layer ACT1 may be disposed on the buffer layer 12. The active layer ACT1 may be the active layer ACT1 of the first transistor T1. These may be disposed to partially overlap with a gate electrode G1 of a first gate conductive layer, etc., which will be described later.

Although only the first transistor T1 among the transistors included in the sub-pixels PXn of the display device 10 is depicted in the drawing, the disclosure is not limited thereto. The display device 10 may include a larger number of transistors. For example, the display device 10 may include more than one transistor in addition to the first transistor T1, i.e., two or three transistors in each of the sub-pixels PXn.

The active layer ACT1 may include polycrystalline silicon, monocrystalline silicon, an oxide semiconductor, etc. When the active layer ACT1 includes an oxide semiconductor, each active layer ACT1 may include conductive regions ACT_a and ACT_b and a channel region ACT_c therebetween. The oxide semiconductor may be an oxide semiconductor containing indium (In). For example, the oxide semiconductor may be indium-tin oxide (ITO), indium-zinc oxide (IZO), indium-gallium oxide (IGO), indium-zinc-tin oxide (IZTO), indium-gallium-tin oxide (IGTO), indium-gallium-zinc oxide (IGZO), indium-gallium-zinc-tin oxide (IGZTO), etc.

In another embodiment, the active layer ACT1 may include polycrystalline silicon. The polycrystalline silicon may be formed by crystallizing amorphous silicon, and in such case, the conductive regions of the active layer ACT1 may be doped regions doped with impurities.

A first gate insulating layer 13 may be disposed on the active layer ACT1 and the buffer layer 12. The first gate insulating layer 13 may include the active layer ACT1 and may be disposed on the buffer layer 12. The first gate insulating layer 13 may work as a gate insulator of each of the thin-film transistors. The first gate insulating layer 13 may be formed of an inorganic layer including an inorganic material, such as silicon oxide (SiOx), silicon nitride (SiNx) and silicon oxynitride (SiOxNy), or may be formed of a stack of the materials.

The first gate conductive layer may be disposed on the first gate insulating layer 13. The first gate conductive layer may include the gate electrode G1 of the first transistor T1 and a first capacitor electrode CSE1 of a storage capacitor. The gate electrode G1 may be disposed so that it overlaps the channel region ACT_c of the active layer ACT1 in the thickness direction. The first capacitor electrode CSE1 may be disposed so that it overlaps a second capacitor electrode CSE2 described later in the thickness direction. According to an embodiment of the disclosure, the first capacitor electrode CSE1 may be integrated with the gate electrode G1. The first capacitor electrode CSE1 may be disposed so that it overlaps the second capacitor electrode CSE2 in the thickness direction, and the storage capacitor may be formed between them.

The first gate conductive layer may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

A first interlayer dielectric layer 15 may be disposed on the first gate conductive layer. The first interlayer dielectric layer 15 may serve as an insulating layer between the first gate conductive layer and other layers disposed thereon. The first interlayer dielectric layer 15 may be disposed so that it covers the first gate conductive layer to protect it. The first interlayer dielectric layer 15 may be formed of an inorganic layer including an inorganic material, such as silicon oxide (SiOx), silicon nitride (SiNx) and silicon oxynitride (SiOxNy), or may be formed of a stack of the materials.

The first data conductive layer may be disposed on the first interlayer dielectric layer 15. The first data conductive layer may include a first source electrode S1 and a first drain electrode D1 of the first transistor T1, a data line DTL, and a second capacitor electrode CSE2.

The first source electrode S1 and the first drain electrode D1 of the first transistor T1 may be in contact with the doped regions ACT_a and ACT_b of the active layer ACT1, respectively, through the contact holes penetrating through the first interlayer dielectric layer 15 and the first gate insulating layer 13. The first source electrode S1 of the first transistor T1 may be electrically connected to the light-blocking layer BML through another contact hole.

A data line DTL may apply a data signal to another transistor (not shown) included in the display device 10. Although not shown in the drawings, the data line DTL may be connected to the source/drain electrodes of another transistor to transfer a signal applied from the data line DTL.

The second capacitor electrode CSE2 may be disposed to overlap the first capacitor electrode CSE1 in the thickness direction. According to an embodiment of the disclosure, the second capacitor electrode CSE2 may be integrally connected to the first source electrode S1.

The first data conductive layer may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

A second interlayer dielectric layer 17 may be disposed on the first data conductive layer. The second interlayer dielectric layer 17 may serve as an insulating layer between the first data conductive layer and other layers disposed thereon. The second interlayer dielectric layer 17 may cover the first data conductive layer to protect it. The second interlayer dielectric layer 17 may be formed of an inorganic layer including an inorganic material, such as silicon oxide (SiOx), silicon nitride (SiNx) and silicon oxynitride (SiOxNy), or may be formed of a stack of the materials.

The second data conductive layer may be disposed on the second interlayer dielectric layer 17. The second data conductive layer may include a first voltage line VL1, a second voltage line VL2, and a first conductive pattern CDP. A high-level voltage (or a first supply voltage) may be applied to the first voltage line VL1 to be supplied to the first transistor T1, and a low-level voltage (or a second supply voltage) may be applied to the second voltage line VL2 to be supplied to the second electrode 22. An alignment signal necessary for aligning the semiconductor layers 30 of the light-emitting elements 100 during the process of fabricating the display device 10 may be applied to the second voltage line VL2.

The first conductive pattern CDP may be connected to the second capacitor electrode CSE2 through a contact hole formed in the second interlayer dielectric layer 17. The second capacitor electrode CSE2 may be integrated with the first source electrode S1 of the first transistor T1, and the first conductive pattern CDP may be electrically connected to the first source electrode S1. The first conductive pattern CDP may also come in contact with the first alignment electrode 21 to be described later. The first transistor T1 may transfer the first supply voltage applied from the first voltage line VL1 to the first alignment electrode 21 through the first conductive pattern CDP. Although the second data conductive layer includes one second voltage line VL2 and one first voltage line VL1 in the example shown in the drawings, the disclosure is not limited thereto. The second data conductive layer may include more than one first voltage lines VL1 and second voltage lines VL2.

The second data conductive layer may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

A first planarization layer 19 may be disposed on the second data conductive layer. The first planarization layer 19 may include an organic insulating material, e.g., an organic material such as polyimide (PI), to provide a flat surface.

On the first planarization layer 19, first banks BNL1, alignment electrodes 21 and 22, a light-emitting element 100, and second banks BNL2 may be disposed. Insulating layers PAS1, PAS2 and PAS3 may be disposed on the first planarization layer 19.

The first banks BNL1 may be disposed directly on the first planarization layer 19. The first banks BNL1 may have a shape extended in the second direction DR2 within each of the sub-pixels PXn, and may not be extended to an adjacent sub-pixel PXn in the second direction DR2. They may be disposed in the emission area EMA. The first banks BNL1 are spaced apart from each other in the first direction DR1, and the light-emitting elements 100 may be disposed therebetween. The first banks BNL1 may be disposed in each of the sub-pixels PXn to form a linear pattern in the display area DPA of the display device 10. Although two first banks BNL1 are shown in the drawings, the disclosure is not limited thereto. More than two first banks BNL1 may be disposed depending on the number of the alignment electrodes 21 and 22.

The first banks BNL1 may have a structure that at least partly protrudes from the upper surface of the first planarization layer 19. The protrusions of the first banks BNL1 may have inclined side surfaces. The light emitted from the light-emitting element 100 may be reflected by the alignment electrodes 21 and 22 disposed on the first banks BNL1 so that the light may exit toward the upper side of the first planarization layer 19. The first banks BNL1 may provide the area in which the light-emitting element 100 is disposed and may also serve as reflective partition walls that reflect light emitted from the light-emitting element 100 upward. The side surfaces of the first banks BNL1 may be inclined in a linear shape, but the disclosure is not limited thereto. The first banks BNL1 may have a semicircle or semi-ellipse shape with curved outer surface. The first banks BNL1 may include, but is not limited to, an organic insulating material such as polyimide (PI).

The alignment electrodes 21 and 22 may be disposed on the first banks BNL1 and the first planarization layer 19. The alignment electrodes 21 and 22 may include the first alignment electrode 21 and the second alignment electrode 22. The alignment electrodes 21 and 22 may be extended in the second direction DR2 and may be spaced apart from each other in the first direction DR1.

The first alignment electrode 21 and the second alignment electrode 22 may be extended in the second direction DR2 in each of the sub-pixels PXn, and they may be separated from other electrodes 21 and 22 in the cut area CBA, respectively. For example, the cut area CBA may be disposed between the emission areas EMA of the neighboring sub-pixels PXn in the second direction DR2, and the first alignment electrode 21 and the second alignment electrode 22 may be separated from other first alignment electrode 21 and second alignment electrode 22 disposed in an adjacent sub-pixel PXn in the second direction DR2 in the cut area CBA. It is, however, to be understood that the disclosure is not limited thereto. Some electrodes 21 and 22 may not be separated for each of the sub-pixels PXn but may be extended and disposed across adjacent sub-pixels PXn in the second direction DR2. Alternatively, only one of the first alignment electrode 21 and the second alignment electrode 22 may be separated.

The first alignment electrode 21 may be electrically connected to the first transistor T1 through a first contact hole CT1, and the second alignment electrode 22 may be electrically connected to the second voltage line VL2 through a second contact hole CT2. For example, an extended part of the first alignment electrode 21 in the first direction DR1 of the second bank BNL2 may be in contact with the first conductive pattern CDP through the first contact hole CT1 penetrating through the first planarization layer 19. An extended part of the second alignment electrode 22 in the first direction DR1 of the second bank BNL2 may be in contact with the second voltage line VL2 through the second contact hole CT2 penetrating through the first planarization layer 19. It is, however, to be understood that the disclosure is not limited thereto. According to another embodiment, the first contact hole CT1 and the second contact hole CT2 may be formed in the emission area EMA surrounded by the second bank BNL2 so that they do not overlap the second bank BNL2.

Although one first alignment electrode 21 and one second alignment electrode 22 are disposed for each of the sub-pixels PXn in the drawings, the disclosure is not limited thereto. More than one first alignment electrodes 21 and more than one second alignment electrodes 22 may be disposed in each of the sub-pixels PXn. The first alignment electrode 21 and the second alignment electrode 22 disposed in each of the sub-pixels PXn may not necessarily have a shape extended in one direction but may have a variety of structures. For example, the first alignment electrode 21 and the second alignment electrode 22 may have a partially curved or bent shape, and one electrode may be disposed to surround the other electrode.

The first alignment electrode 21 and the second alignment electrode 22 may be disposed directly on the first banks BNL1, respectively. The first alignment electrode 21 and the second alignment electrode 22 may have a larger width than the first banks BNL1. For example, the first alignment electrode 21 and the second alignment electrode 22 may be disposed to cover the outer surfaces of the first banks BNL1. The first alignment electrode 21 and the second alignment electrode 22 may be respectively disposed on the side surfaces of the first banks BNL1, and the distance between the first alignment electrode 21 and the second alignment electrode 22 may be smaller than the distance between the first banks BNL1. At least a part of the first alignment electrode 21 and the second alignment electrode 22 may be disposed directly on the first planarization layer 19 so that they may be located on the same plane. It is, however, to be understood that the disclosure is not limited thereto. In some implementations, the alignment electrodes 21 and 22 may have a width smaller than that of the first banks BNL1. It is to be noted that the alignment electrodes 21 and 22 may be disposed to cover at least one side surface of the first banks BNL1 to reflect light emitted from the light-emitting element 100.

Each of the alignment electrodes 21 and 22 may include a conductive material having a high reflectance. For example, each of the alignment electrodes 21 and 22 may include a metal such as silver (Ag), copper (Cu) and aluminum (Al) as the material having a high reflectance, and may be an alloy including aluminum (Al), nickel (Ni), lanthanum (La), etc. Each of the alignment electrodes 21 and 22 may reflect light that is emitted from the light-emitting element 100 and travels toward the side surfaces of the first banks BNL1 toward the upper side of each of the sub-pixels PXn.

It is, however, to be understood that the disclosure is not limited thereto. Each of the alignment electrodes 21 and 22 may further include a transparent conductive material. For example, each of the alignment electrodes 21 and 22 may include a material such as indium tin oxide (ITO), indium zinc oxide (IZO) and indium tin zinc oxide (ITZO). In some embodiments, each of the alignment electrodes 21 and 22 may have a structure in which one or more layers of a transparent conductive material and a metal layer having high reflectivity are stacked, or may be made up of a single layer including them. For example, each of the alignment electrodes 21 and 22 may have a stack structure such as ITO/silver (Ag)/ITO/, ITO/Ag/IZO, or ITO/Ag/ITZO/IZO.

Among the alignment electrodes 21 and 22, the first alignment electrode 21 may be electrically connected to the light-emitting elements 100, and a voltage may be applied so that the light-emitting elements 100 may emit light. The first alignment electrode 21 may be electrically connected to the light-emitting element 100 through a first contact electrode CNE1 and may transfer an electrical signal applied to the first alignment electrode 21 to the light-emitting element 100 through the first contact electrode CNE1. The first alignment electrode 21 may be electrically connected to an anode of the light-emitting element 100 or may be electrically connected to a cathode thereof.

The alignment electrodes 21 and 22 may be utilized to form an electric field within the sub-pixel PXn to align the semiconductor layer 30 of the light-emitting element 100. The semiconductor layer 30 of the light-emitting element 100 may be disposed between the first alignment electrode 21 and the second alignment electrode 22 by the electric field formed over the first alignment electrode 21 and the second alignment electrode 22. The semiconductor layer 30 of the light-emitting element 100 may be ejected onto the alignment electrodes 21 and 22 via an inkjet printing process. When an ink containing the semiconductor layers 30 of the light-emitting elements 100 is ejected onto the alignment electrodes 21 and 22, an alignment signal is applied to the alignment electrodes 21 and 22 to generate an electric field. The semiconductor layers 30 of the light-emitting elements 100 dispersed in the ink may receive a dielectrophoretic force due to the electric field generated over the alignment electrodes 21 and 22 and may be aligned on the alignment electrodes 21 and 22.

The first insulating layer PAS1 may be disposed on the first planarization layer 19. The first insulating layer PAS1 may be disposed to cover the first banks BNL1, the first electrodes 21 and the second electrodes 22. The first insulating layer PAS1 may protect the first alignment electrode 21 and the second alignment electrode 22 and insulate them from each other. This can prevent that the light-emitting element 100 disposed on the first insulating layer PAS1 may be brought into contact with other elements and damaged.

According to an embodiment of the disclosure, the first insulating layer PAS1 may include an opening OP partially exposing the first alignment electrode 21. The opening OP may expose a part of the first alignment electrode 21 disposed on the upper surface of the first bank BNL1. The first electrode CNE1 may be in contact with the exposed part of the first alignment electrode 21 through the opening OP.

The first insulating layer PAS1 may have a level difference so that a part of the upper surface may be recessed between the first alignment electrode 21 and the second alignment electrode 22. For example, as the first insulating layer PAS1 may be disposed to cover the first alignment electrode 21 and the second alignment electrode 22, the upper surface thereof may have level differences along the shape of the alignment electrodes 21 and 22 disposed thereunder. It is, however, to be understood that the disclosure is not limited thereto.

The second bank BNL2 may be disposed on the first insulating layer PAS1. The second bank BNL2 may be disposed in a lattice pattern on the entire surface of the display area DPA including portions extended in the first direction DR1 and the second direction DR2 when viewed from the top. The second bank BNL2 may be disposed along the border of each of the sub-pixels PXn to distinguish adjacent sub-pixels PXn from one another.

The second bank BNL2 may be disposed to surround the emission area EMA and the cut area CBA disposed in each of the sub-pixels PXn to distinguish them. The first alignment electrode 21 and the second alignment electrode 22 may be extended in the second direction DR2 and may be disposed across a portion of the second bank BNL2 that may be extended in the first direction DR1. The part of the second bank BNL2 extended in the second direction DR2 may have a larger width between the emission areas EMA than between the cut areas CBA. Accordingly, the distance between the cut areas CBA may be smaller than the distance between the emission areas EMA.

The second bank BNL2 may have a height greater than a height of the first banks BNL1. The second bank BNL2 can prevent the inks in which different semiconductor layers 30 are dispersed for different sub-pixels PXn from overflowing to adjacent sub-pixels PXn during the inkjet printing process of the processes of fabricating the display device 10, so that different sub-pixels PXn can be separated from one another and thus the inks are not mixed. The second bank BNL2 may include, but is not limited to, polyimide (PI), like the first banks BNL1.

Referring to FIGS. 2 to 4, the light-emitting element 100 may be disposed on the first insulating layer PAS1. The light-emitting element 100 may include a first electrode CNE1, a semiconductor layer 30, an organic functional layer OL, and a second electrode CNE2.

The light-emitting element 100 disposed in each of the sub-pixels PXn may include a light emitting layer 150 (see FIG. 4) including different materials and may emit lights in different wavelength ranges to the outside. Accordingly, lights of the first color, the second color and the third color may exit from the first sub-pixel PX1, the second sub-pixel PX2 and the third sub-pixel PX3, respectively. It is, however, to be understood that the disclosure is not limited thereto. The sub-pixels PXn may include the same kind of the organic light emitting layer 150 and may emit light of substantially the same color.

The semiconductor layers 30 of the light-emitting elements 100 may be spaced apart from one another along the second direction DR2 in which the alignment electrodes 21 and 22 are extended, and may be aligned substantially parallel to one another. The semiconductor layers 30 may have a shape extended in one direction. The direction in which the alignment electrodes 21 and 22 are extended (the second direction DR2) may be substantially perpendicular to the direction in which the semiconductor layers 30 are extended (the first direction DR1). It is, however, to be understood that the disclosure is not limited thereto. The semiconductor layers 30 may be oriented obliquely to the direction in which the alignment electrodes 21 and 22 are extended, rather than being perpendicular to the alignment electrodes 21 and 22.

Both ends of the semiconductor layer 30 may be disposed on and overlap the alignment electrodes 21 and 22 between the first banks BNL1. The length of the semiconductor layer 30 may be larger than the distance between the first alignment electrode 21 and the second alignment electrode 22, and the both ends of the semiconductor layer 30 may be disposed on the first alignment electrode 21 and the second alignment electrode 22, respectively. For example, one end of the semiconductor layer 30 may be located on the first alignment electrode 21, while the other end thereof may be located on the second alignment electrode 22.

The semiconductor layer 30 may be an n-type semiconductor. The semiconductor layer 30 may include a semiconductor material having the following chemical formula: $Al_xGa_yIn_{1-x-y}N$ ($0 \leq x \leq 1$, $0 \leq y \leq 1$, $0 \leq x+y \leq 1$). For example, it may be at least one of n-type doped AlGaInN, GaN, AlGaN, InGaN, AlN and InN. The semiconductor layer 30 may be doped with an n-type dopant, and the n-type dopant may be Si, Ge, Sn, etc., for example. According to an embodiment of the disclosure, the semiconductor layer 30 may be n-GaN doped with n-type Si.

Referring to FIG. 5, the semiconductor layer 30 may have a size in micrometers or nanometers and may be formed of an inorganic material. The semiconductor layer 30 may be aligned between two electrodes facing each other as polarities are created by forming an electric field in a particular direction between the two electrodes. The semiconductor layer 30 may be aligned between two electrodes by an electric field formed over the two electrodes.

The semiconductor layer 30 according to an embodiment may have a shape extended in one direction. The semiconductor layer 30 may have a shape of a cylinder, a rod, a wire, a tube, etc. It is to be understood that the shape of the semiconductor layer 30 is not limited thereto. The semiconductor layer 30 may have a variety of shapes including a polygonal column shape such as a cube, a cuboid and a hexagonal column, or a shape that may be extended in a direction with partially inclined outer surfaces. The length of the semiconductor layer 30 may be, but is not limited to, in the range of 1.5 µm to 5 µm.

The second insulating layer PAS2 may be partially disposed on the semiconductor layer 30. For example, the second insulating layer PAS2 may have a width smaller than the length of the semiconductor layer 30 and may be disposed on the semiconductor layer 30 so that the both ends of the semiconductor layer 30 are exposed while being surrounded by it. The second insulating layer PAS2 may be disposed to cover the semiconductor layer 30, the alignment electrodes 21 and 22 and the first insulating layer PAS1 and then may be removed so that the both ends of the semiconductor layer 30 are exposed during the process of fabricating the display device 10. The second insulating layer PAS2 may be extended in the second direction DR2 on the first insulating layer PAS1 when viewed from the top, thereby forming a linear or island-like pattern in each of the sub-pixels PXn. The second insulating layer PAS2 can protect the semiconductor layer 30 and fix the semiconductor layer 30 during the process of fabricating the display device 10.

An organic functional layer OL may be disposed on a part of the semiconductor layer 30 and above the first insulating layer PAS1. The organic functional layer OL may be disposed on a part of the semiconductor layer 30 while surrounding the semiconductor layer 30. The organic functional layer OL may have a width smaller than the length of the semiconductor layer 30 and may be extended in the second direction DR2 when viewed from the top. The organic functional layer OL may be formed in a linear or island pattern within each sub-pixel PXn.

As shown in FIG. 4, the organic functional layer OL may include at least the organic light emitting layer 150 and may include one or more selected from a hole transport layer 160 and a hole injection layer 170. In an embodiment, the organic functional layer OL may include the organic light emitting layer 150, the hole transport layer 160 disposed on the organic light emitting layer 150, and the hole injection layer 170 disposed on the hole transport layer 160.

The organic light emitting layer 150 disposed on each sub-pixel PXn may emit light of blue, green or red or may emit light of the same color.

When the organic light emitting layer 150 emits blue light, the organic light emitting layer 150 may include, for example, a host material such as CBP(4,4'-bis(carbazol-9-yl)biphenyl), and may be formed of a phosphorescent material including a dopant material containing an iridium series. Alternatively, the organic light emitting layer 150 may be formed of, but is not limited to, a fluorescent material including one selected from the group consisting of: spiro-BDAVBi(2,7-bis)4-diphenylamino)styryl)-9,9-spirofluorene), spiro-CBP(2,2',7,7'-tetrakis(carbozol-9-yl)-9,9-spirofluorene), distill benzene (DSB), distrylarylene (DSA), a PFO-based polymer, and a PPV-based polymer.

When the organic light emitting layer 150 emits green light, the organic light emitting layer 150 may include, for example, a host material such as CBP(4,4'-bis(carbazol-9-yl)biphenyl) and may be formed of a phosphorescent material including a dopant material including an iridium series. Alternatively, the organic light emitting layer 150 may be formed of, but is not limited to, a fluorescent material including Alq3(tris(8-hydroxyquinolino)aluminum).

When the organic light emitting layer 150 emits red light, the organic light emitting layer 150 may include, for example, a host material such as CBP(4,4'-bis(carbazol-9-yl)biphenyl), and may be formed of a phosphorescent material including a dopant including one or more selected from the group consisting of: Ir(PIQ)2(acac)(bis(1-phenylisoquinoline)acetylacetonate iridium(III)), Ir(PIQ)3(tris(1-phenylquinoline)iridium(III)) and PtOEP (octaethylporphine platinum). Alternatively, the organic light emitting layer 150 may be formed of, but is not limited to, a fluorescent material including PBD: Eu(DBM)3(Phen) or perylene.

The hole transport layer 160 may be disposed on the organic light emitting layer 150. The hole transport layer 160 may facilitate the transport of holes and may be formed of, but is not limited to, at least one selected from the group consisting of: NPD(N,N-bis(naphthalene-1-yl)-N,N'-bis(phenyl)-2,2'-dimethylbenzidine), TPD(N,N'-bis-(3-methylphenyl)-N,N-bis-(phenyl)-benzidine), spiro-TAD(2,2',7,7'-tetrakis(N,N-diphenylamino)-9,9-spirofluorene) and MTDATA(4,4',4"-Tris(N-3-methylphenyl-N-phenylamino)-triphenylamine). The thickness of the hole transport layer 160 may be, but is not limited to, in the range of 1 to 150 nm.

The hole injection layer 170 may be disposed on the hole transport layer 160. The hole injection layer 170 may facilitate the injection of holes from the second electrode CNE2 to the organic light emitting layer 150 and may be formed of, but is not limited to, at least one selected from the group consisting of: CuPc(copper phthalocyanine), PEDOT(poly(3,4)-ethylenedioxythiophene), PANI(polyaniline) and NPD(N,N-bis(naphthalene-1-yl)-N,N'-bis(phenyl)-2, 2'-dimethylbenzidine). The thickness of the hole injection layer 170 may be, but is not limited to, in the range of 1 to 150 nm. The hole injection layer 170 may be eliminated depending on the structure and characteristics of the light-emitting element 100.

The first electrode CNE1 may be disposed on the semiconductor layer 30, the first insulating layer PAS1 and the second insulating layer PAS2. The first electrode CNE1 may have a shape extended in one direction and may be disposed on and overlap the first alignment electrode 21. The first electrode CNE1 may form a stripe pattern in the emission area EMA of each sub-pixel PXn.

The first electrode CNE1 may be in contact with the semiconductor layer 30 of the light-emitting element 100. The first electrode CNE1 may be in contact with and electrically connected with a part of the semiconductor layer 30. One side of the first electrode CNE1 in contact with a part of the semiconductor layer 30 may be disposed on the second insulating layer PAS2. The first electrode CNE1 may be in contact with the first alignment electrode 21 through the opening OP exposing a part of the upper surface of the first alignment electrode 21.

The width of the first electrode CNE1 that may be measured in one direction may be smaller than the width of the first alignment electrode 21 that may be measured in that direction. The first electrode CNE1 may be disposed to cover a part of the upper surface of the first alignment electrode 21 while being in contact with one end and a part of the upper surface of the semiconductor layer 30. It is, however, to be understood that the disclosure is not limited thereto. The width of the first electrode CNE1 may be larger than that of the first alignment electrode 21 so that it may cover both sides of the first electrode 21.

The first electrode CNE1 may work as a cathode electrode, which may be an electron injection electrode, and may be formed of magnesium (Mg), calcium (Ca), aluminum (Al), silver (Ag) which have a low work function, or an alloy thereof. For example, the first electrode CNE1 may be a magnesium-silver alloy (Mg—Ag).

The second electrode CNE2 may be disposed on the organic functional layer OL. The second electrode CNE2 may have a shape extended in one direction and may be disposed on and overlap the organic functional layer OL. The second electrode CNE2 may be spaced apart from the first electrode CNE1 by a distance and may be extended parallel to each other. The second electrode CNE2 may form a stripe pattern in the emission area EMA of each sub-pixel PXn.

The second electrode CNE2 may be in contact with the organic functional layer OL of the light-emitting element 100. The second electrode CNE2 may be in contact with at least a part of the organic functional layer OL, for example, the entire upper surface of the organic functional layer OL may be electrically connected to the second electrode CNE2. The second electrode CNE2 may not be in contact with the side surface of the organic functional layer OL but may be in contact only with the upper surface of the organic functional layer OL. The second electrode CNE2 may not overlap the adjacent second insulating layer PAS2, but the disclosure is not limited thereto. The second electrode CNE2 may overlap a part of the upper surface of the second insulating layer PAS2.

The second electrode CNE2 may be disposed to overlap the second alignment electrode 22 at least partially. The width of the second electrode CNE2 that may be measured in one direction may be smaller than the width of the second alignment electrode 22 that may be measured in that direction. The width of the second electrode CNE2 that may be measured in one direction may be smaller than the width of the first electrode CNE1 that may be measured in that direction.

The second electrode CNE2 may be an anode electrode for injecting holes. The second electrode CNE2 may be formed as a transparent conductive layer so that light emitted from the organic light emitting layer 150 disposed thereunder may pass through it, and may be formed of a material having a high work function. The second electrode CNE2 may be, for example, one of indium tin oxide (ITO), indium zinc oxide (IZO), indium tin zinc oxide (ITZO) and zinc oxide (ZnO).

The third insulating layer PAS3 may be disposed entirely on the display area DPA of the first substrate 11. The third insulating layer PAS3 can protect the elements disposed on the first substrate 11 against the external environment. It is to be noted that the third insulating layer PAS3 may be eliminated.

Each of the above-described first insulating layer PAS1, second insulating layer PAS2 and third insulating layer PAS3 may include an inorganic insulating material or an organic insulating material. For example, the first insulating layer PAS1, the second insulating layer PAS2 and the third insulating layer PAS3 may include an inorganic insulating material such as silicon oxide (SiOx), silicon nitride (SiNx), silicon oxynitride (SiOxNy), aluminum oxide ($Al_2O_3$) and aluminum nitride (AlN). Alternatively, they may include, as an organic insulating material, an acrylic resin, an epoxy resin, a phenol resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, a polymethyl methacrylate-polycarbonate synthetic resin, etc. It is, however, to be understood that the disclosure is not limited thereto.

Referring back to FIG. 4, according to this embodiment, the semiconductor layer 30 of the light-emitting element 100 may be aligned between the first alignment electrode 21 and the second alignment electrode 22, and then the organic functional layer OL, the first electrode CNE1 and the second electrode CNE2 are formed.

Typically, an inorganic light-emitting diode may be formed in a cylindrical shape having a lateral structure in which an active layer, a p-type GaN semiconductor layer and an electrode layer are sequentially stacked on a side of the n-type GaN semiconductor layer of FIG. 4. In such case, the inorganic light-emitting diodes may emit light only when they are aligned in the same direction between the both electrodes. For example, if the n-type GaN semiconductor layer may be electrically connected to one electrodes of some of the inorganic light-emitting diodes while the p-type GaN semiconductor layer may be connected to the other electrodes thereof, and the p-type GaN semiconductor layer may be connected to one electrodes of some others of the inorganic light-emitting diodes while the n-type semiconductor layer may be electrically connected to the other electrodes thereof, only some of the inorganic light-emitting diodes may emit light while the other inorganic light-emitting diodes that are align in the opposite direction may not emit light. Accordingly, the luminous efficiency of the inorganic light-emitting diodes may be randomly determined based on how they are aligned. Light may be emitted from the active layer of the inorganic light-emitting diodes in the form of a point light source. Accordingly, the emission area may be narrow and the luminous efficiency may be low.

In contrast, according to the embodiment of FIG. 4 described above, the semiconductor layers 30 may be aligned between the first alignment electrode 21 and the second alignment electrode 22 in any direction because the semiconductor layers 30 are formed of a single semiconductor material. In other words, according to this embodiment, the alignment direction does not matter as long as the semiconductor layers 30 are arranged parallel to each other between the first alignment electrode 21 and the second alignment electrode 22.

According to an embodiment of the disclosure, by forming the organic functional layer OL and the second electrode CNE2 on the aligned semiconductor layers 30, the area where the semiconductor layers 30, the organic functional layer OL and the second electrode CNE2 overlap one another may work as the emission area. As a result, the emission area may be increased significantly. Hereinafter, more detailed description thereon will be made with reference to the accompanying drawings.

Figure 6:
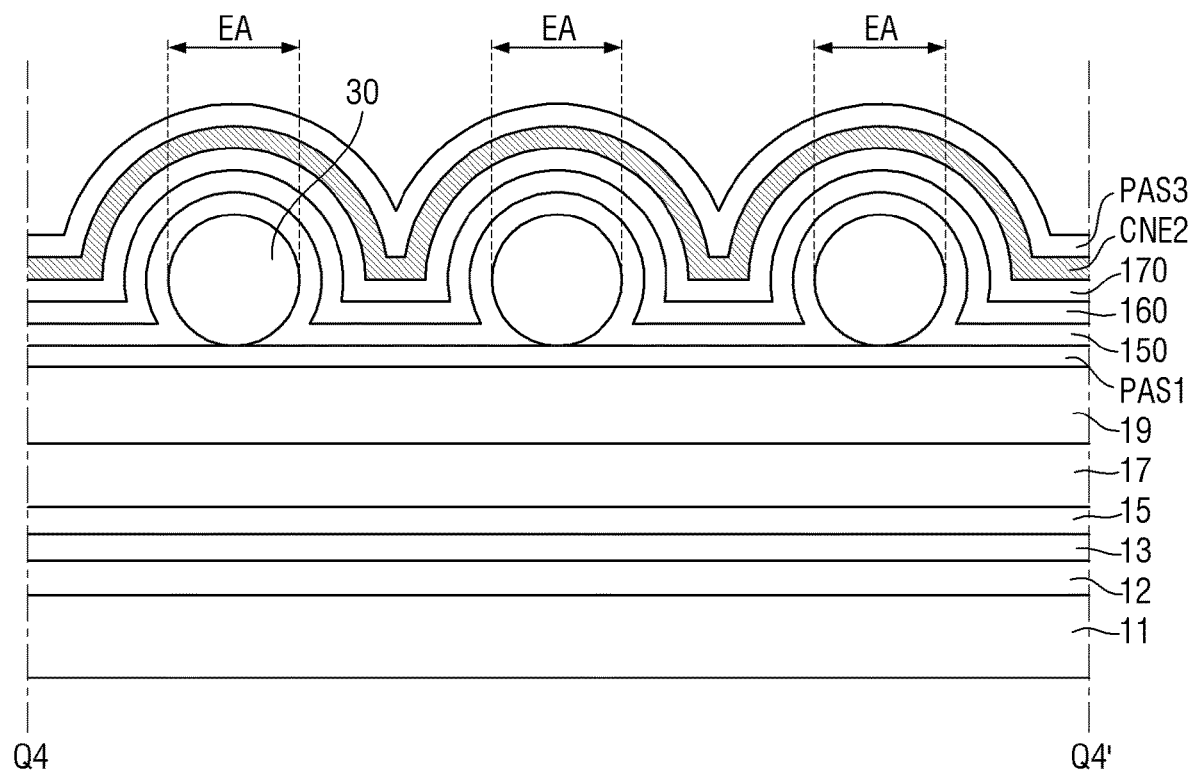
FIG. 6 is cross-sectional view taken along line Q4-Q4' of FIG. 2.
Figure 7:
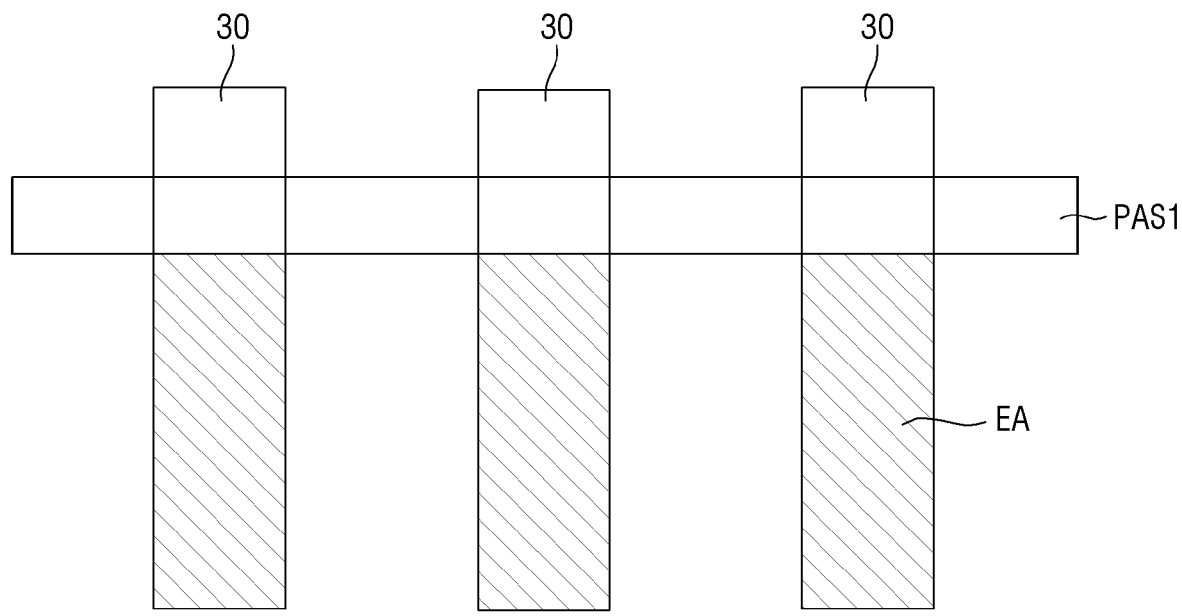
FIG. 7 is a plan view schematically showing emission areas of a light-emitting element according to an embodiment of the disclosure.
Figure 8:
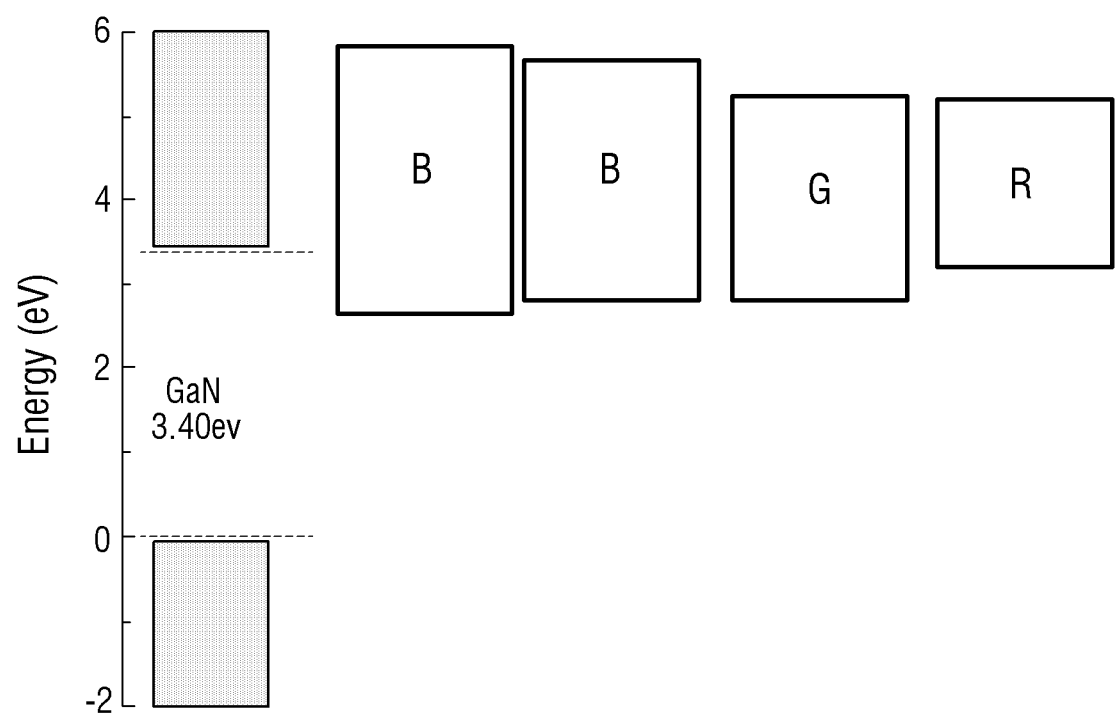
FIG. 8 is an energy band diagram of semiconductor layers and light emitting layers.

FIG. 6 is cross-sectional view taken along line Q4-Q4' of FIG. 2. FIG. 7 is a plan view schematically showing emission areas of a light-emitting element according to an embodiment of the disclosure. FIG. 8 is an energy band diagram of semiconductor layers and light emitting layers.

Referring to FIGS. 6 and 7 in conjunction with FIGS. 2 to 4 described above, semiconductor layers 30 may be disposed on the first insulating layer PAS1 such that they are spaced apart from each other by a distance. The organic light emitting layer 150, the hole transport layer 160, the hole injection layer 170, the second electrode CNE2 and the third insulating layer PAS3 may be stacked sequentially on the first insulating layer PAS1 and the semiconductor layers 30.

The first electrode CNE1 may be electrically connected to some of the semiconductor layers 30 to inject electrons, and the semiconductor layers 30 may transfer electrons to the organic light emitting layer 150. The organic light emitting layer 150 and the second electrode CNE2 may be electrically connected to the hole injection layer 170 to inject holes, and the hole injection layer 170 and the hole transport layer 160 may transfer the injected holes to the organic light emitting layer 150. In the organic light emitting layer 150, electrons and holes may form excitons to emit light.

Referring to FIG. 8, the LUMO (Lowest Occupied Molecular Orbital) level of the semiconductor layers 30 formed of n-type GaN may be 0 eV, and the HOMO (Highest Occupied Molecular Orbital) level thereof may be approximately 3.40 eV. Accordingly, the energy band gap, which equals to the difference therebetween, may be approximately 3.40 eV. In an embodiment, the HOMO level of blue emissive materials (B) may range approximately from 5.45 to 5.7 eV, the LUMO level thereof may range approximately from 2.6 to 2.68, and the energy band gap may range approximately from 2.76 to 3.1 eV. The HOMO level of green emissive material (G) may be equal to approximately 5.1 eV, the LUMO level thereof may be equal to approximately 2.7 eV, and the energy band gap may be equal to approximately 2.4 eV. The HOMO level of red emissive material (R) may be equal to approximately 5.1 eV, the LUMO level thereof may be equal to approximately 3.1 eV, and the energy band gap may be equal to approximately 2 eV. This may mean that the electrons injected from the first electrode CNE1 may be sufficiently transferred from the semiconductor layer 30 to the organic light emitting layer 150, and lights of blue, green and red may be emitted from the organic light emitting layer 150.

An emission area EA of the light-emitting element 100 that emits light as described above may be the area where the semiconductor layer 30, the organic light emitting layer 150, the hole transport layer 160, the hole injection layer 170 and the second electrode CNE2 may overlap one another. The emission area EA may be substantially identical to the area of the semiconductor layer 30 when viewed from the top. The emission area EA of the light-emitting element 100 may be implemented in the form of a surface light source. Accordingly, in an embodiment, the emission area EA in the form of the surface light source may be formed, and thus the emission area may be increased to improve the luminous efficiency.

The organic light emitting layer 150 of the light-emitting element 100 may be disposed in a curved shape along the shape of the semiconductor layer 30. In an embodiment, when the semiconductor layer 30 may be cylindrical, the organic light emitting layer 150 may be formed in a round shape. For example, the cross-sectional structure of the organic light emitting layer 150 may be formed in a rounded shape that may be convex upward, not a horizontal layer structure. In another embodiment, when the semiconductor layer 30 may be formed of a polygonal pillar, the organic light emitting layer 150 may be disposed in a form in which at least a part thereof may be bent upward. Accordingly, light emitted from the emission area EA of the light-emitting element 100 may exit not only through the upper portion but also through the both side portions thereof, thereby improving the viewing angle.

Figure 9:
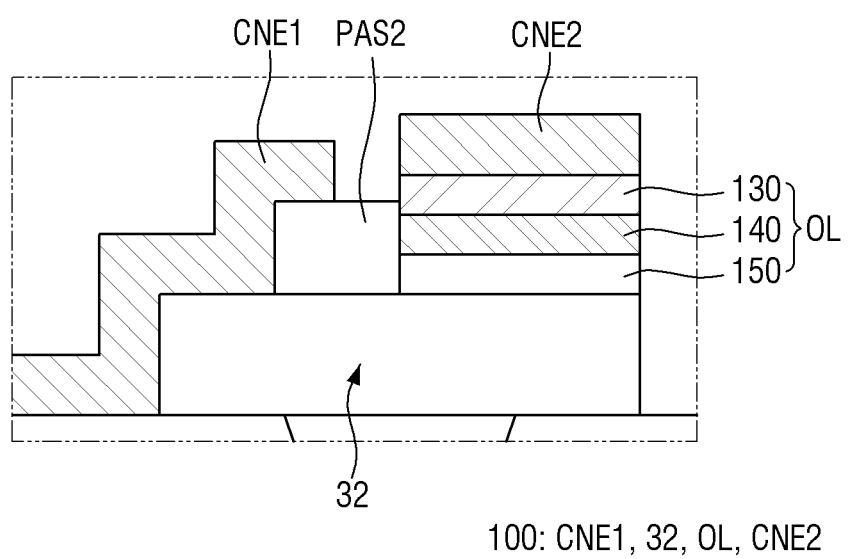
FIG. 9 is a cross-sectional view showing another example of a light-emitting element of a display device according to an embodiment.

FIG. 9 is a cross-sectional view showing another example of a light-emitting element of a display device according to an embodiment.

Referring to FIG. 9, the light-emitting element 100 may include a first electrode CNE1, a semiconductor layer 32, an organic functional layer OL, and a second electrode CNE2. The embodiment of FIG. 9 is different from the embodiment of FIGS. 2 to 7 in that materials of the first electrode CNE1, the semiconductor layer 32, the organic functional layer OL, and the second electrode CNE2 are different. In the following description, the description will focus on the difference and the redundant description will be omitted.

Referring to FIG. 9, a semiconductor layer 32 may be a p-type semiconductor that transfers holes. For example, the semiconductor layer 32 may include a semiconductor material having the following chemical formula: $Al_xGa_yIn_{1-x-y}N$ ($0 \leq x \leq 1$, $0 \leq y \leq 1$, $0 \leq x+y \leq 1$). For example, it may be at least one of p-type doped AlGaInN, GaN, AlGaN, InGaN, AlN and InN. The semiconductor layer 32 may be doped with a p-type dopant, and the p-type dopant may be Mg, Zn, Ca, Se, Ba, etc., for example. According to an embodiment of the disclosure, the semiconductor layer 32 may be p-GaN doped with p-type Mg.

The organic functional layer OL may include at least the organic light emitting layer 150 and may include one or more selected from an electron transport layer 140 and an electron injection layer 130. In an embodiment, the organic functional layer OL may include the electron transport layer 140 disposed on the organic light emitting layer 150 and the electron injection layer 130 disposed on the electron transport layer 140.

The electron transport layer 140 may facilitate the transport of electrons and may be formed of, but is not limited to, at least one selected from the group consisting of: Alq3(tris (8-hydroxy-quinolinato)aluminum), PBD(2-(4-biphenyl)-5-(4-tert-butylphenyl)-1,3,4-oxadiazole), TAZ(3-(4-biphenyl))-4-phenyl-5-tert-butylphenyl-1,2,4-triazole), DPT(2-biphenyl-4-yl-4,6-bis-(4'-pyridin-2-yl-biphenyl-4-yl)-[1,3,5]triazine) and BAlq(Bis(2-methyl-8-quinolinolate)-4-(phenylphenolato)aluminum). The thickness of the electron transport layer 140 may range from 1 μm to 150 μm.

The electron injection layer 130 may facilitate the transport of electrons and may be formed of, but is not limited to, Alq3(tris(8-hydroxy-quinolinato)aluminum), PBD(2-(4-biphenyl)-5-(4-tert-butylphenyl)-1,3,4-oxadiazole), TAZ(3-(4-biphenyl)-4-phenyl-5-tert-butylphenyl-1,2,4-triazole), and BAlq(Bis(2-methyl-8-quinolinolate)-4-(phenylphenolato)aluminum). On the other hand, the electron injection layer 130 may be formed of a metal compound, and the metal compound may be, but is not limited to, at least one selected from the group consisting of: LiQ, LiF, NaF, KF, RbF, CsF, FrF, $BeF_2$, $MgF_2$, $CaF_2$, $SrF_2$, $BaF_2$ and $RaF_2$. The thickness of the electron injection layer 130 may range from 1 μm to 50 μm.

The first electrode CNE1 may work as an anode electrode for injecting holes and may be formed of a material having a high work function. The first electrode CNE1 may be, for example, one of indium tin oxide (ITO), indium zinc oxide (IZO), indium tin zinc oxide (ITZO) and zinc oxide (ZnO).

The second electrode CNE2 may work as a cathode electrode for injecting electrons and may be formed of magnesium (Mg), calcium (Ca), aluminum (Al), silver (Ag) which have a low work function, or an alloy thereof. For example, the second electrode CNE2 may be a magnesium-silver alloy (Mg—Ag).

According to the embodiment described above with reference to FIGS. 2 to 7, the semiconductor layer 30 may be formed of a semiconductor such as n-type GaN, such that electrons are injected from the first electrode CNE1 while holes are injected from the second electrode CNE2 so that light may be emitted from the organic light emitting layer 150. In contrast, according to this embodiment, the semiconductor layer 32 may be formed of a semiconductor such as p-type GaN, such that holes are injected from the first electrode CNE1 while electrons are injected from the second electrode CNE2 so that light may be emitted from the organic light emitting layer 150.

Figure 10:
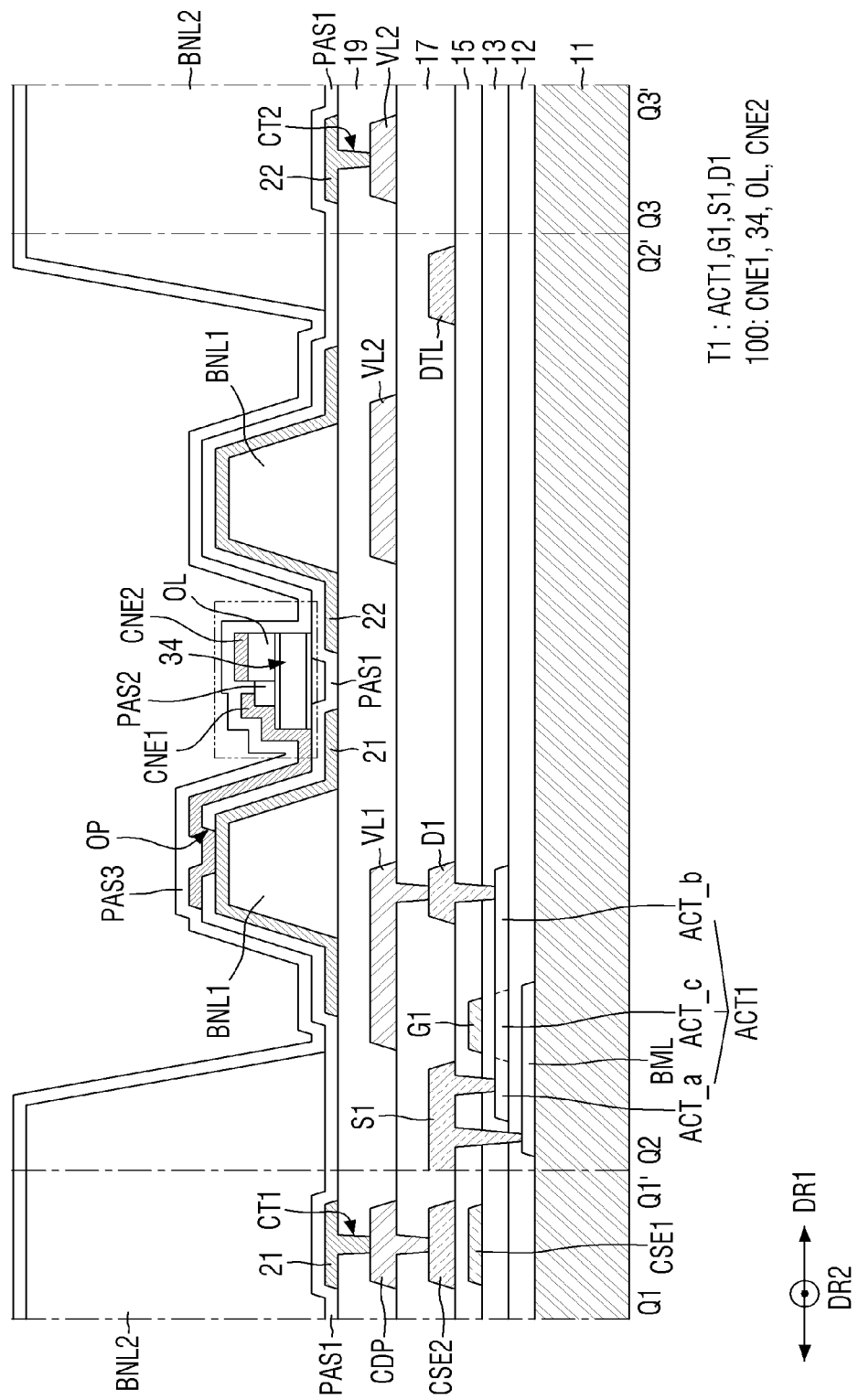
FIG. 10 is a cross-sectional view showing a display device according to another embodiment of the disclosure.
Figure 11:
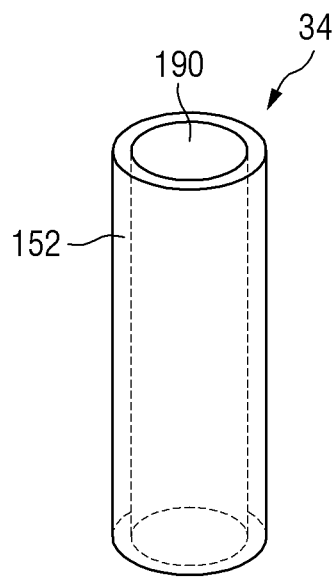
FIG. 11 is a perspective view showing a semiconductor layer according to another embodiment of the disclosure.
Figure 12:
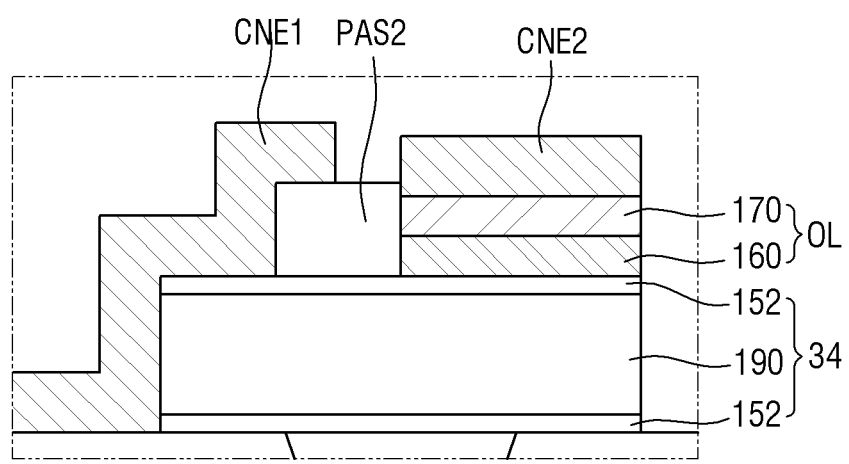
FIG. 12 is an enlarged view of a light-emitting element according to another embodiment of the disclosure.
Figure 13:
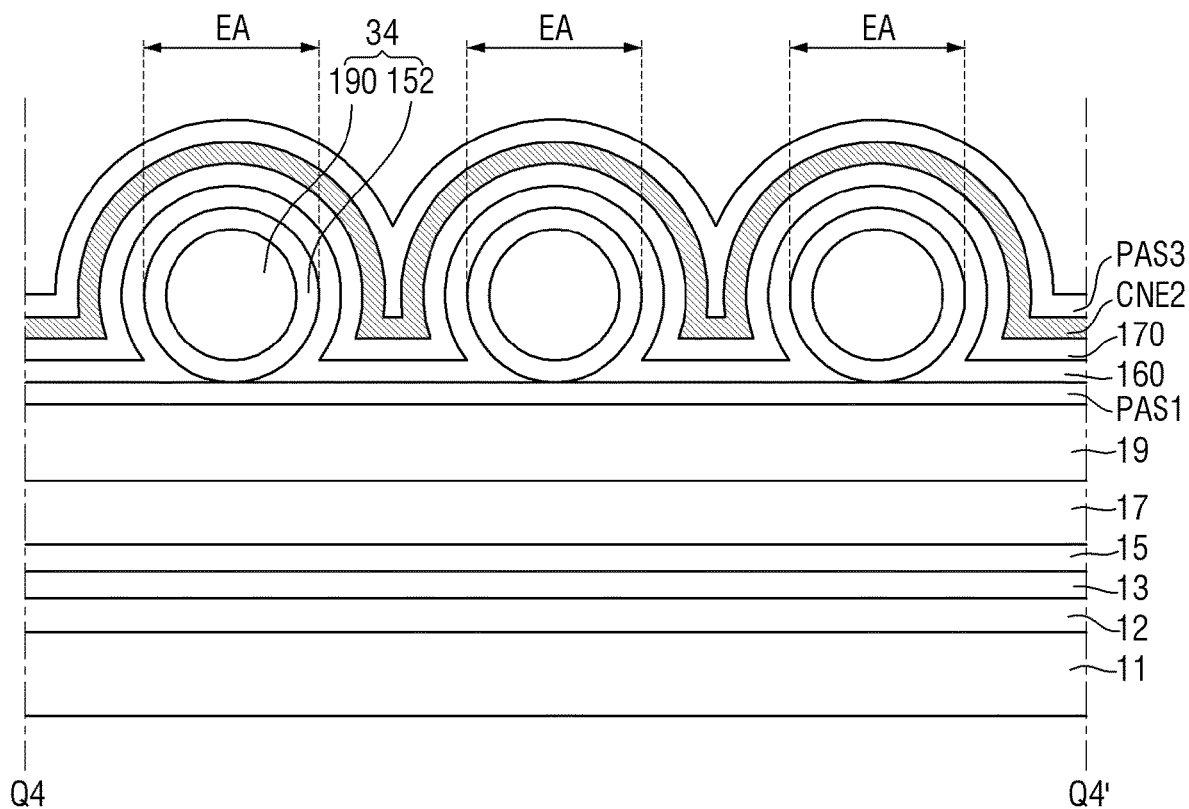
FIG. 13 is a cross-sectional view showing a display device according to another embodiment of the disclosure.

FIG. 10 is a cross-sectional view showing a display device according to another embodiment of the disclosure. FIG. 11 is a perspective view showing a semiconductor layer according to another embodiment of the disclosure. FIG. 12 is an enlarged view of a light-emitting element according to another embodiment of the disclosure. FIG. 13 is a cross-sectional view showing a display device according to another embodiment of the disclosure.

A display device 10 according to the embodiment of FIG. 10 is different from the above-described embodiments of FIGS. 2 to 7 in that the former further includes a semiconductor layer 34 including an inorganic light emitting layer 152 surrounding its outer circumferential surface. In the following description, the description will focus on the difference and the redundant description will be omitted.

Referring to FIGS. 10 to 12, the light-emitting element 100 according to this embodiment may include a first electrode CNE1 electrically connected to a part of the semiconductor layer 34, an organic functional layer OL disposed on another part of the semiconductor layer 34, and a second electrode CNE2 disposed on the organic functional layer OL.

The semiconductor layer 34 may include a semiconductor part 190 and an inorganic light emitting layer 152 surrounding an outer circumferential surface of the semiconductor part 190.

The semiconductor part 190 may have a shape extended in one direction. According to an embodiment of the disclosure, the semiconductor part 190 may be formed in, but is not limited to, a cylindrical shape. The semiconductor part 190 may be formed in one shape selected from a rod, a wire, and a polygonal column.

The semiconductor part 190 may be an n-type semiconductor. The semiconductor part 190 may include a semiconductor material having the following chemical formula: $Al_xGa_yIn_{1-x-y}N$ ($0 \le x \le 1$, $0 \le y \le 1$, $0 \le x+y \le 1$). For example, it may be at least one of n-type doped AlGaInN, GaN, AlGaN, InGaN, AlN and InN. The semiconductor part 190 may be doped with an n-type dopant, and the n-type dopant may be Si, Ge, Sn, etc., for example. According to an embodiment of the disclosure, the semiconductor part 190 may be n-GaN doped with n-type Si.

The inorganic light emitting layer 152 may surround the outer circumferential surface of the semiconductor part 190 and may be disposed on the semiconductor part 190. For example, the inorganic light emitting layer 152 may surround at least the outer circumferential surface of the semiconductor part 190 and may be extended in the direction in which the semiconductor part 190 may be extended. The inorganic light emitting layer 152 may be formed to surround the outer circumferential surface on the side surface of the semiconductor part 190, while both ends of the semiconductor part 190 in the longitudinal direction may be exposed. In an embodiment, one end of the inorganic light-light emitting layer 152 may be aligned with one end of the semiconductor part 190, and the other end of the inorganic light emitting layer 152 may be aligned with the other end of the semiconductor part 190.

The inorganic light emitting layer 152 may include a material having a single or multiple quantum well structure. When the inorganic light emitting layer 152 includes a material having the multiple quantum well structure, quantum layers and well layers may be alternately stacked in the structure. The inorganic light emitting layer 152 may emit light by forming excitons of electrons and holes according to an electric signal applied through the semiconductor part 190 and the organic functional layer OL to be described later. For example, when the inorganic light emitting layer 152 emits light of the blue wavelength band, it may include a material such as AlGaN and AlGaInN. In particular, when the inorganic light emitting layer 152 has a multi-quantum well structure in which quantum layers and well layers are alternately stacked on one another, the quantum layers may include AlGaN or AlGaInN, and the well layers may include a material such as GaN and AlGaN. According to an embodiment of the disclosure, the inorganic light emitting layer 152 includes AlGaInN as the quantum layer and AlInN as the well layer, and, as described above, the inorganic light emitting layer 152 may emit blue light having a center wavelength band of 450 nm to 495 nm.

It is, however, to be understood that the disclosure is not limited thereto. The inorganic light emitting layer 152 may have a structure in which a semiconductor material having a large energy band gap and a semiconductor material having a small energy band gap are alternately stacked on one another, and may include other Group III to Group V semiconductor materials depending on the wavelength range of the emitted light. The light emitted from the inorganic light emitting layer 152 is not limited to the light of the blue wavelength band. The inorganic light emitting layer 152 may emit light of red or green wavelength band in some implementations.

The first electrode CNE1 may be electrically connected to a part of the semiconductor layer 34 on one side, and the organic functional layer OL and the second electrode CNE2 may be stacked on a part of the semiconductor layer 34 on the opposite side and may be electrically connected to semiconductor layer 34. The organic functional layer OL may include a hole transport layer 160 and a hole injection layer 170, which may be identical to the hole transport layer 160 and the hole injection layer 170, respectively, described above with reference to FIG. 4.

According to this embodiment, the semiconductor layer 34 includes the semiconductor part 190 and the inorganic light emitting layer 152, and electrons are injected from the first electrode CNE1 and holes are injected from the second electrode CNE2 so that light may be emitted from form the inorganic light emitting layer 152. Specifically, electrons injected from the first electrode CNE1 may be transferred to the inorganic light emitting layer 152 through the semiconductor part 190 of the semiconductor layer 34. Some of the electrons injected from the first electrode CNE1 may be transferred directly to the inorganic light emitting layer 152. Holes injected from the second electrode CNE2 are transferred to the inorganic light emitting layer 152 through the hole injection layer 170 and the hole transport layer 160, so that holes and electrons form excitons in the inorganic light emitting layer 152 to emit light.

Referring to FIG. 13, also in this embodiment, the light-emitting element 100 may have the emission area equal to that of the embodiment of FIG. 6 described above.

As described above, the emission area EA of the light-emitting element 100 that emits light may be the area where the semiconductor part 190 and the inorganic light emitting layer 152 of the semiconductor layer 34, the hole transport layer 160, the hole injection layer 170 and the second electrode CNE2 may overlap one another. The emission area EA may be substantially identical to the area of the semiconductor layer 34 when viewed from the top. The emission area EA of the light-emitting element 100 may be implemented in the form of a surface light source. Accordingly, in an embodiment, the emission area EA in the form of the surface light source may be formed, and thus the emission area may be increased to improve the luminous efficiency.

The inorganic light emitting layer 152 of the light-emitting element 100 may be disposed in a curved shape along the shape of the semiconductor layer 34. In an embodiment, when the semiconductor layer 34 may be cylindrical, the inorganic light emitting layer 152 may be formed in a round shape. For example, the cross-sectional structure of the inorganic light emitting layer 152 may be formed in a rounded shape that may be convex upward, not a horizontal layer structure. In another embodiment, when the semiconductor layer 34 may be implemented as a polygonal pillar, at least a part of the inorganic light emitting layer 152 may be bent upward. Accordingly, light emitted from the emission area EA of the light-emitting element 100 may exit not only through the upper portion but also through the both side portions thereof, thereby improving the viewing angle.

Figure 14:
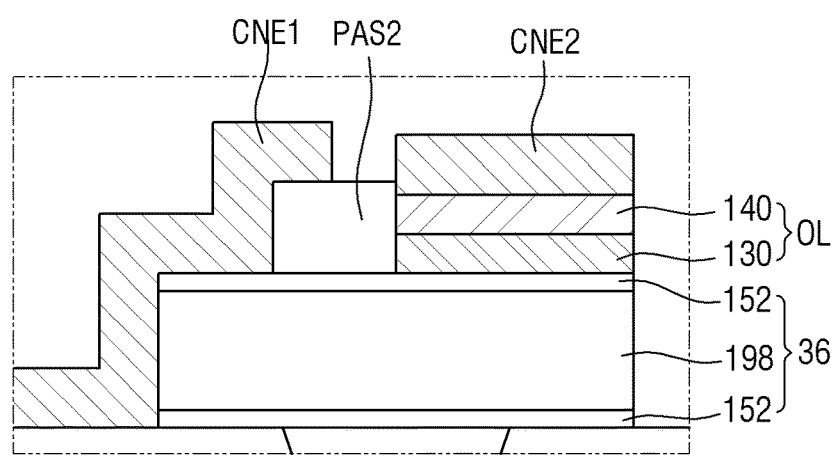
FIG. 14 is a cross-sectional view showing another example of a light-emitting element of a display device according to another embodiment.

FIG. 14 is a cross-sectional view showing another example of a light-emitting element of a display device according to another embodiment.

Referring to FIG. 14, the light-emitting element 100 may include a first electrode CNE1, a semiconductor layer 36, an organic functional layer OL, and a second electrode CNE2. The embodiment of FIG. 14 is different from the embodiment of FIGS. 10 to 13 in that materials of the first electrode CNE1, the semiconductor layer 36, the organic functional layer OL, and the second electrode CNE2 are different. In the following description, the description will focus on the difference and the redundant description will be omitted.

A semiconductor part 198 of the semiconductor layer 34 may be a p-type semiconductor that transfers holes. For example, the semiconductor part 198 may include a semiconductor material having the following chemical formula: $Al_xGa_yIn_{1-x-y}N$ ($0 \leq x \leq 1$, $0 \leq y \leq 1$, $0 \leq x+y \leq 1$). For example, it may be at least one of p-type doped AlGaInN, GaN, AlGaN, InGaN, AlN and InN. The semiconductor part 198 may be doped with a p-type dopant, and the p-type dopant may be Mg, Zn, Ca, Se, Ba, etc., for example. According to an embodiment of the disclosure, the semiconductor part 198 may be p-GaN doped with p-type Mg.

The organic functional layer OL may include at least the organic light emitting layer 150 and may include one or more selected from the electron transport layer 140 and the electron injection layer 130. In an embodiment, the organic functional layer OL may include the electron transport layer 140 disposed on the organic light emitting layer 150 and the electron injection layer 130 disposed on the electron transport layer 140.

The first electrode CNE1 may work as an anode electrode for injecting holes and may be formed of a material having a high work function. The first electrode CNE1 may be, for example, one of indium tin oxide (ITO), indium zinc oxide (IZO), indium tin zinc oxide (ITZO) and zinc oxide (ZnO).

The second electrode CNE2 may work as a cathode electrode for injecting electrons and may be formed of magnesium (Mg), calcium (Ca), aluminum (Al), silver (Ag) which have a low work function, or an alloy thereof. For example, the second electrode CNE2 may be a magnesium-silver alloy (Mg—Ag).

According to the embodiment described above with reference to FIGS. 10 to 13, the semiconductor part 190 of a semiconductor layer 36 may be formed of a semiconductor such as n-type GaN, such that electrons are injected from the first electrode CNE1 while holes are injected from the second electrode CNE2 so that light may be emitted from the inorganic light emitting layer 152. In contrast, according to this embodiment, the semiconductor part 198 of the semiconductor layer 36 may be formed of a semiconductor such as p-type GaN, such that holes are injected from the first electrode CNE1 while electrons are injected from the second electrode CNE2 so that light may be emitted from the inorganic light emitting layer 152.

FIGS. 15 to 21 are cross-sectional views showing some of the processing steps of fabricating a display device according to an embodiment of the disclosure. Hereinafter, a method for fabricating at least a light-emitting element of the display device disclosed in FIG. 3.

Figure 15:
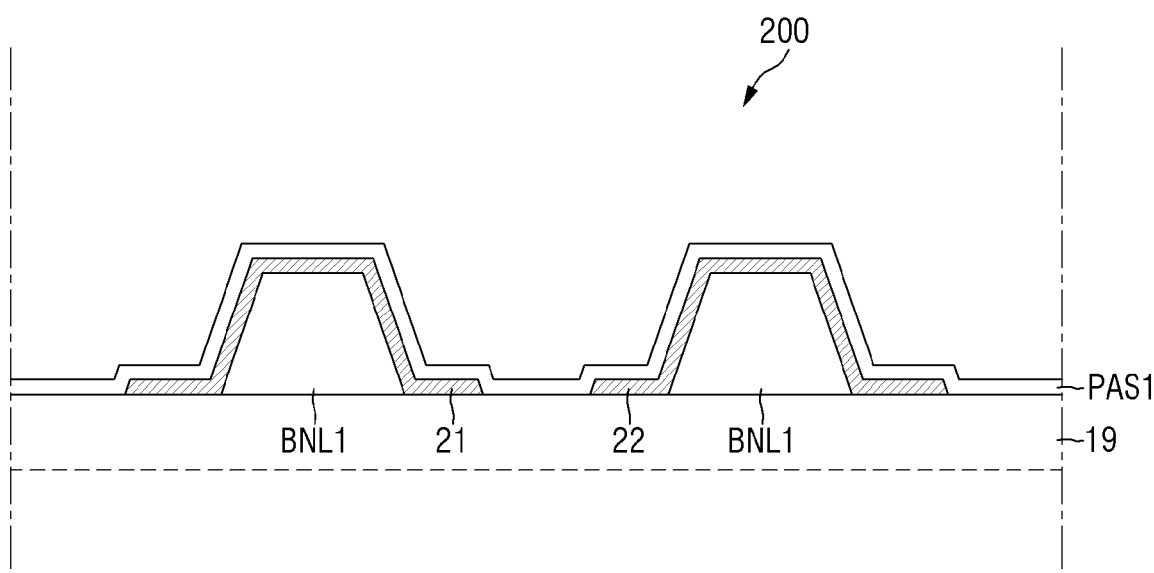
FIGS. 15 to 21 are cross-sectional views showing some of the processing steps of fabricating a display device according to an embodiment of the disclosure.

Referring to FIG. 15, a substrate 200 including a first planarization layer 19 may be prepared. Although not shown in the drawings, the substrate may include sub-pixels SPn including circuit elements including conductive layers and insulating layers.

Subsequently, first banks BNL1 spaced apart from each other may be formed on the first planarization layer 19. The first banks BNL1 may have a shape protruding from the upper surface of the first planarization layer 19 in a third direction DR3. The description thereon has already been given above.

Subsequently, a first alignment electrode 21 and a second alignment electrode 22 are formed on the first banks BNL1. The first alignment electrode 21 and the second alignment electrode 22 are extended in the second direction D2. The first alignment electrode 21 and the second alignment electrode 22 may be extended in the second direction DR2 during the processing steps of fabricating the display device 10 and may be disposed in other sub-pixels PXn as well. They may be formed during a subsequent process by disposing the semiconductor layer 30 and then cutting the first alignment electrode 21 and the second alignment electrode 22 in the cut area CBA (see FIG. 2) of each sub-pixel PXn. Subsequently, the first insulating layer PAS1 may be formed on the first planarization layer 19 including the first alignment electrode 21 and the second alignment electrode 22.

Figure 16:
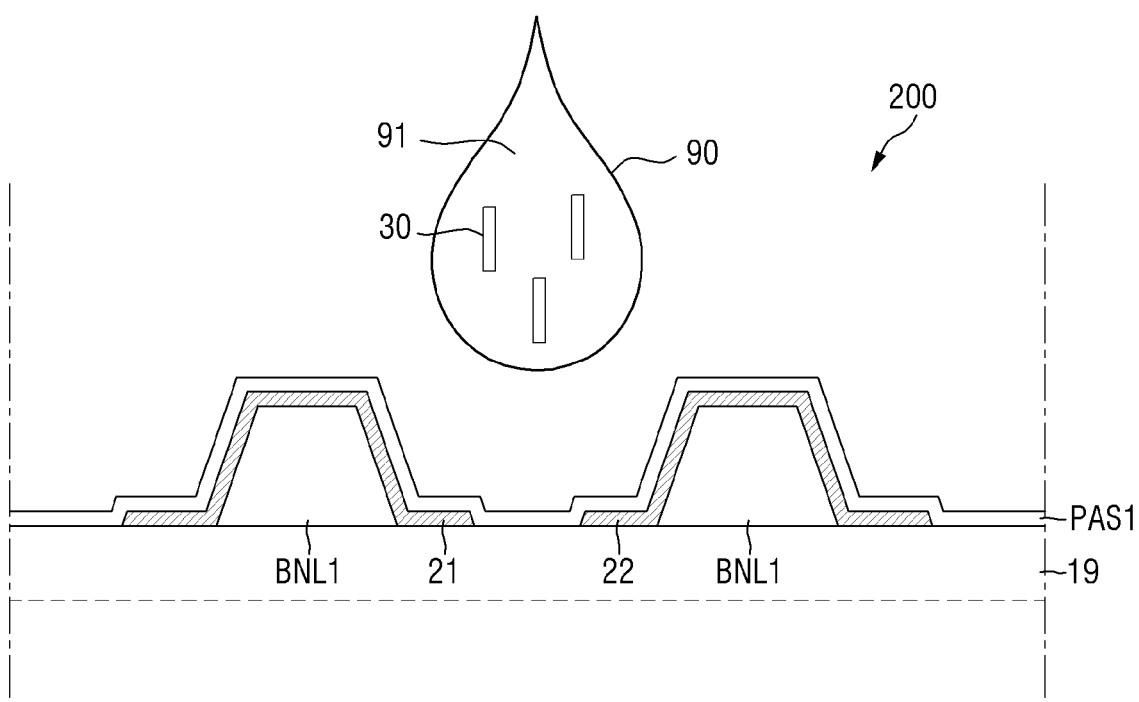
Figure 16:
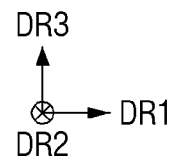
Figure 17:
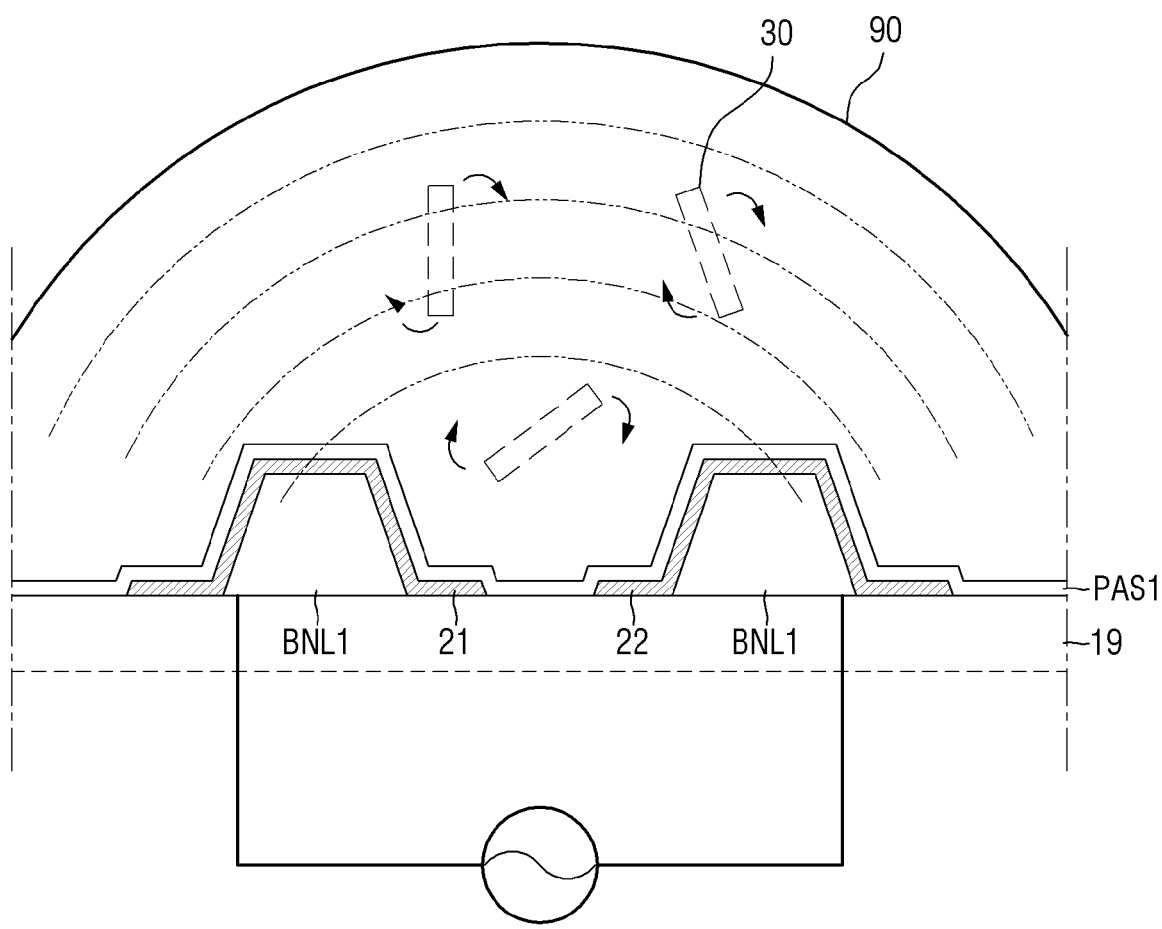
Figure 18:
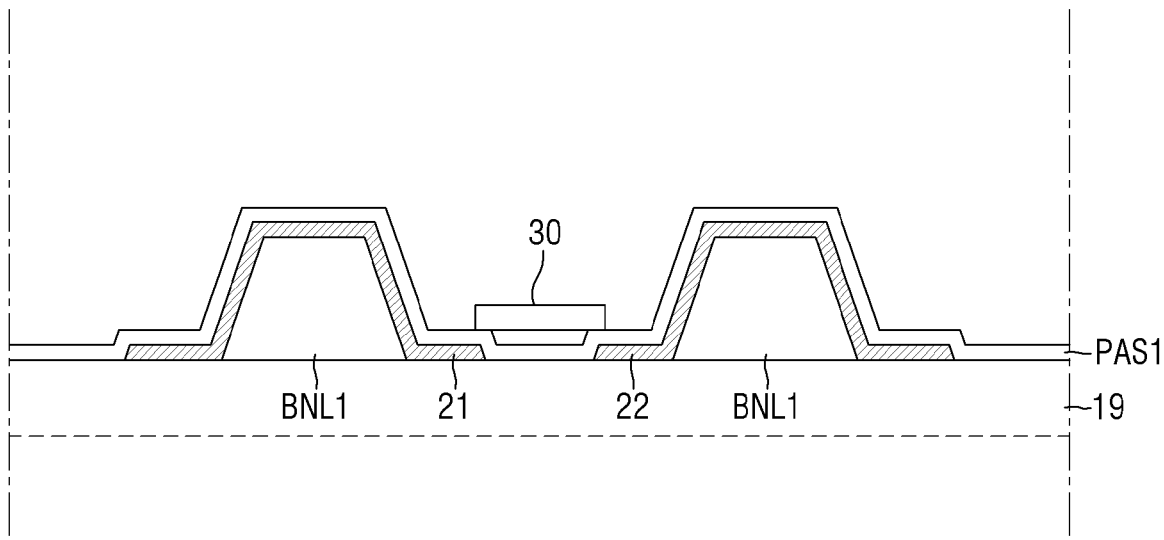

Subsequently, referring to FIGS. 16 to 18, a semiconductor layer 30 may be aligned by applying a semiconductor ink 90 onto the first insulating layer PAS1. Specifically, the semiconductor ink 90 in which the semiconductor layers 30 are dispersed in a solvent 91 may be ejected by inkjet printing. The semiconductor layers 30 may be seated on the first insulating layer PAS1 such that they are aligned in one direction by electric field. In some embodiments, the semiconductor layers 30 may receive a dielectrophoretic force by an electric field generated over the first insulating layer PAS1 and may be disposed between the first alignment electrode 21 and the second alignment electrode 22.

The orientations of the semiconductor layers 30 in a shape extended in one direction in the semiconductor ink 90 may vary depending on the direction of the electric field. According to an embodiment of the disclosure, the semiconductor layers 30 may be aligned such that the direction in which they are extended may be oriented toward the direction in which the electric field is directed. When the electric field generated over the first insulating layer PAS1 may be parallel to the upper surface of the substrate, the semiconductor layers 30 may be aligned such that the direction in which they are extended may be parallel to the substrate, and may be disposed between the first alignment electrode 21 and the second alignment 22.

According to the embodiment of the disclosure, the semiconductor layers 30 are formed only of one of a p-type semiconductor material and an n-type semiconductor material, instead of being formed of a p-type semiconductor material as well as an n-type semiconductor material located at different positions, and thus it is not necessary to align the semiconductor layers 30 so that they are oriented in particular directions. As a result, the processes may become easier.

Subsequently, the solvent 91 of the semiconductor ink 90 may be removed. The solvent 91 may be removed by irradiating heat or infrared rays onto the substrate 200. As the solvent 91 may be removed from the ink 90, the flow of the semiconductor layers 30 may be prevented and they may be seated on the first and second alignment electrodes 21 and 22.

Figure 19:
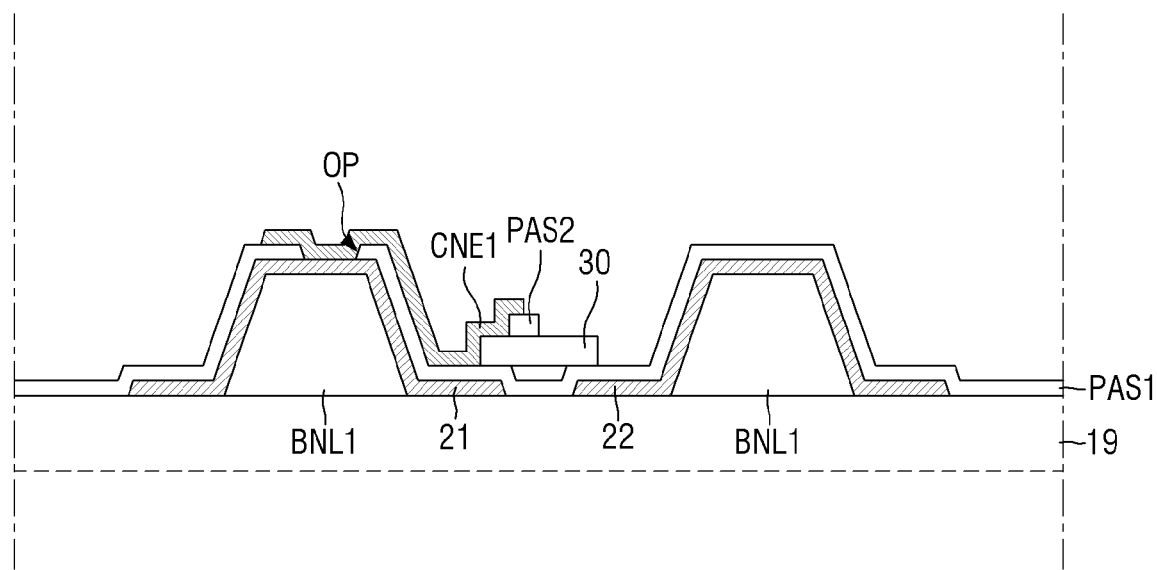

Subsequently, referring to FIG. 19, by forming a second insulating layer PAS2 in a pattern shape on at least a part of the semiconductor layer 30, the flow of the semiconductor layer 30 may be prevented and the semiconductor layer 30 may be fixed. Subsequently, an opening OP exposing the first alignment electrode 21 may be formed in the first insulating layer PAS1. Subsequently, a first electrode CNE1 connected to the first alignment electrode 21 may be formed on the first insulating layer PAS1 and the second insulating layer PAS2. The first electrode CNE1 may be formed to be in contact with a part of the semiconductor layer 30, for example, a side surface and a part of the upper surface of the semiconductor layer 30.

Figure 20:
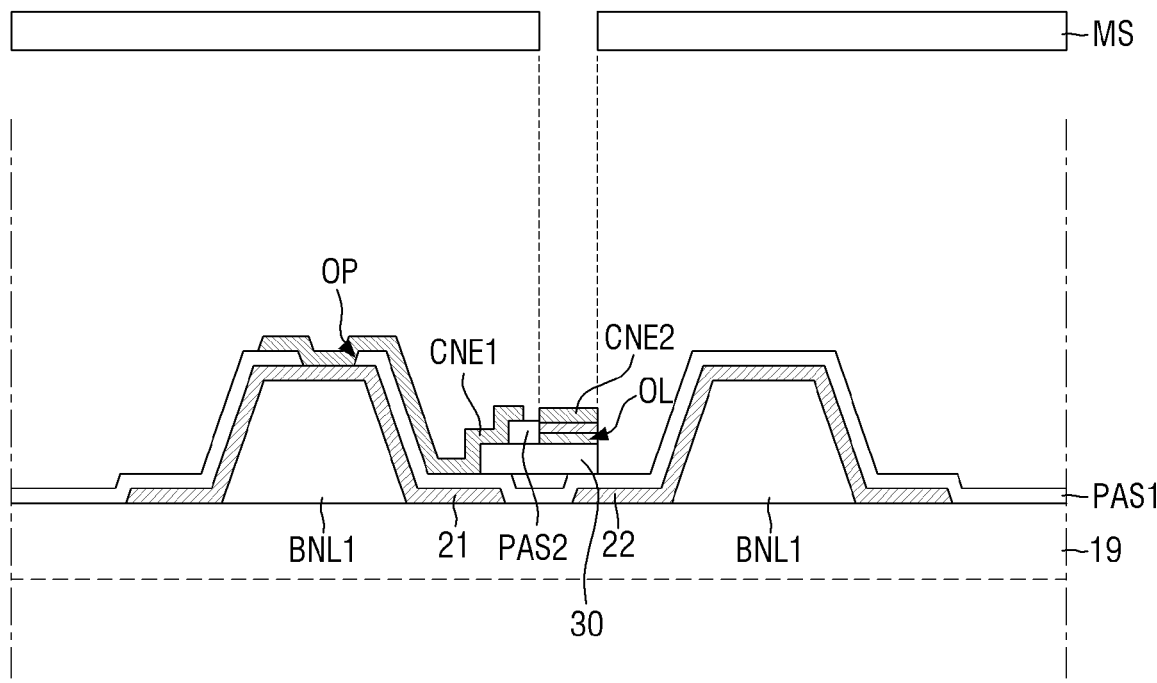

Subsequently, referring to FIG. 20, a mask MS may be aligned above the substrate and an organic functional layer OL may be stacked on the semiconductor layer 30. In doing so, a fine metal mask FMM may be used as the mask MS. As shown in FIGS. 2 and 7, the organic functional layer OL may be continuously deposited on the semiconductor layers 30 and the first insulating layer PAS1 to form a linear shape.

Figure 21:
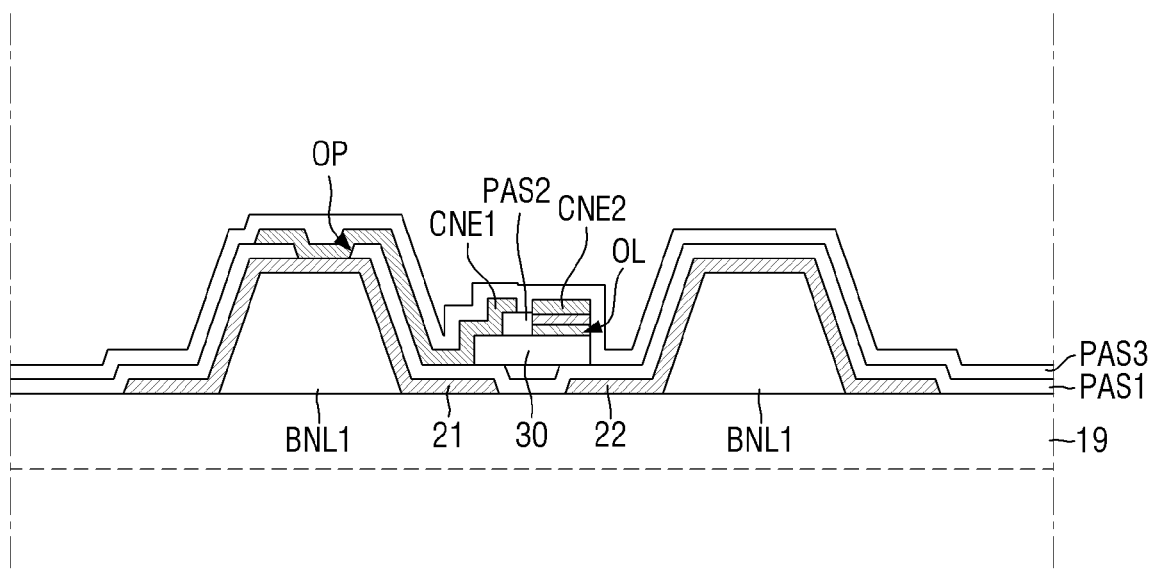

Subsequently, referring to FIG. 21, a second electrode CNE2 may be formed on the organic functional layer OL, and a third insulating layer PAS3 may be formed on the entire surface of the substrate including the second electrode CNE2, thereby fabricating the display device.

In concluding the detailed description, those skilled in the art will appreciate that many variations and modifications can be made to the preferred embodiments without substantially departing from the principles of the invention. Therefore, the disclosed preferred embodiments of the invention are used in a generic and descriptive sense only and not for purposes of limitation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure as set forth in the following claims including equivalents thereof.

What is claimed is:

1. A display device comprising:
 a first bank and a second bank spaced apart from each other and disposed on a substrate;
 at least one semiconductor layer disposed between the first bank and the second bank;
 a first electrode disposed on the first bank and electrically connected to a part of the at least one semiconductor layer;
 an organic functional layer disposed on another part of the at least one semiconductor layer and comprising an organic light emitting layer; and
 a second electrode disposed on the organic functional layer.

2. The display device of claim 1, wherein the at least one semiconductor layer comprises an n-type dopant and is made of a semiconductor having chemical formula:

$$Al_xGa_yIn_{1-x-y}N$$

wherein $0 \leq x \leq 1$, $0 \leq y \leq 1$ and $0 \leq x+y \leq 1$.

3. The display device of claim 2, wherein the organic functional layer comprises at least one of a hole transport layer and a hole injection layer between the organic light emitting layer and the second electrode.

4. The display device of claim 3, wherein
 the first electrode is a cathode electrode, and
 the second electrode is an anode electrode.

5. The display device of claim 1, wherein the at least one semiconductor layer comprises a p-type dopant and is made of a semiconductor having chemical formula:

$$Al_xGa_yIn_{1-x-y}N$$

wherein $0 \leq x \leq 1$, $0 \leq y \leq 1$ and $0 \leq x+y \leq 1$.

6. The display device of claim 5, wherein the organic functional layer comprises at least one of an electron transport layer and an electron injection layer between the organic light emitting layer and the second electrode.

7. The display device of claim 6, wherein
 the first electrode is an anode electrode, and
 the second electrode is a cathode electrode.

8. The display device of claim 1, wherein
 the first electrode overlaps the first bank and extends parallel to the first bank, and
 the first electrode contacts a side surface and a part of an upper surface of the at least one semiconductor layer.

9. The display device of claim 8, wherein
 the second electrode extends parallel to the first electrode and overlaps the at least one semiconductor layer and the organic functional layer, and
 an area where the at least one semiconductor layer, the organic functional layer and the second electrode overlap one another is an emission area.

10. The display device of claim 9, further comprising:
 an insulating layer that extends parallel to the first electrode, crosses a direction in which the at least one semiconductor layer extends, and overlaps the at least one semiconductor layer.

11. The display device of claim 1, wherein the at least one semiconductor layer has a shape of a cylinder, a rod, a wire, a polygonal column, or a combination thereof.

12. A display device comprising:
 a first bank and a second bank spaced apart from each other and disposed on a substrate;
 at least one semiconductor layer disposed between the first bank and the second bank and comprising an inorganic light emitting layer surrounding an outer circumferential surface of the at least one semiconductor layer;
 a first electrode disposed on the first bank and electrically connected to a part of the at least one semiconductor layer;
 an organic functional layer disposed on the inorganic light emitting layer of the at least one semiconductor layer; and
 a second electrode disposed on the organic functional layer.

13. The display device of claim 12, wherein
the at least one semiconductor layer comprises a semiconductor part surrounded by the inorganic light emitting layer, and
ends of the semiconductor part in a longitudinal direction are aligned with ends of the inorganic light emitting layer in the longitudinal direction, respectively.

14. The display device of claim 13, wherein the semiconductor part comprises an n-type dopant and is made of a semiconductor having chemical formula:

$$Al_xGa_yIn_{1-x-y}N$$

wherein $0 \leq x \leq 1$, $0 \leq y \leq 1$ and $0 \leq x+y \leq 1$.

15. The display device of claim 14, wherein the organic functional layer comprises at least one of a hole transport layer and a hole injection layer between the inorganic light emitting layer and the second electrode.

16. The display device of claim 15, wherein
the first electrode is a cathode electrode, and
the second electrode is an anode electrode.

17. The display device of claim 13, wherein the semiconductor part comprises a p-type dopant and is made of a semiconductor having chemical formula:

$$Al_xGa_yIn_{1-x-y}N$$

wherein $0 \leq x \leq 1$, $0 \leq y \leq 1$ and $0 \leq x+y \leq 1$.

18. The display device of claim 17, wherein the organic functional layer comprises at least one of an electron transport layer and an electron injection layer between the inorganic light emitting layer and the second electrode.

19. The display device of claim 18, wherein
the first electrode is an anode electrode, and
the second electrode is a cathode electrode.

20. The display device of claim 13, wherein
the first electrode overlaps the first bank and extends parallel to the first bank, and
the first electrode contacts an end of the semiconductor part of the at least one semiconductor layer.

* * * * *